United States Patent [19]

Hirasawa et al.

[11] Patent Number: 5,001,327
[45] Date of Patent: Mar. 19, 1991

[54] APPARATUS AND METHOD FOR PERFORMING HEAT TREATMENT ON SEMICONDUCTOR WAFERS

[75] Inventors: Shigeki Hirasawa, Ibaraki; Takuji Torii, Ushiku; Tomoji Watanabe, Ibaraki; Toshihiro Komatsu, Ibaraki; Kazuo Honma, Ibaraki; Akihiko Sakai, Ibaraki; Tetsuya Takagaki, Tokorozawa; Toshiyuki Uchino; Hiroto Nagatomo, both of Tokyo, all of Japan

[73] Assignee: Hitachi, Ltd., Tokyo, Japan

[21] Appl. No.: 242,175

[22] Filed: Sep. 9, 1988

[30] Foreign Application Priority Data

Sep. 11, 1987 [JP] Japan .................................. 62-226389
Jul. 29, 1988 [JP] Japan .................................. 63-188477
Sep. 5, 1988 [JP] Japan .................................. 63-221859

[51] Int. Cl.⁵ ............................................... F27B 5/16
[52] U.S. Cl. ..................................... 219/390; 219/382; 219/411; 118/729
[58] Field of Search ................ 219/390, 354, 405, 411, 219/388; 118/50.1, 725, 728, 729; 437/247, 248

[56] References Cited

U.S. PATENT DOCUMENTS

| | | | |
|---|---|---|---|
| 3,385,921 | 5/1968 | Hampton | 219/390 |
| 3,828,722 | 8/1974 | Reuter | 118/729 |
| 3,836,751 | 9/1974 | Anderson | 219/405 |
| 4,101,759 | 7/1978 | Anthony | 219/405 |
| 4,348,580 | 9/1982 | Drexel | 219/390 |
| 4,535,228 | 8/1985 | Mimura | 219/405 |
| 4,539,933 | 9/1985 | Campbell | 118/724 |
| 4,579,080 | 4/1986 | Martin | 118/724 |
| 4,610,748 | 9/1986 | Engle | 118/728 |
| 4,649,261 | 3/1987 | Sheets | 219/390 |
| 4,755,654 | 7/1988 | Crowley | 219/390 |
| 4,806,321 | 2/1989 | Nishizawa | 118/725 |

FOREIGN PATENT DOCUMENTS 0187249 7/1986 European Pat. Off. .
60-236217 11/1985 Japan .................................. 119/724

OTHER PUBLICATIONS

Barbee, S. G., "Flat Plate ... for LPCVD", IBM Tech. Disc. Bull., vol. 26, No. 12, May 1984, pp. 6497–6498.

Primary Examiner—Teresa J. Walberg
Attorney, Agent, or Firm—Antonelli, Terry, Stout & Kraus

[57] ABSTRACT

An apparatus for containing semiconductor wafers and performing heat treatment thereon. Heaters disposed in a high temperature furnace form at least one heating space therein. An insertion and retrieval aperture is disposed at the lower portion of each heating space for allowing passage of wafers therethrough. Each of the heating spaces is adapted to receive one or two wafers and to provide simultaneous and uniform heat treatment on the wafers.

40 Claims, 28 Drawing Sheets

FIG. 4
FIG. 5
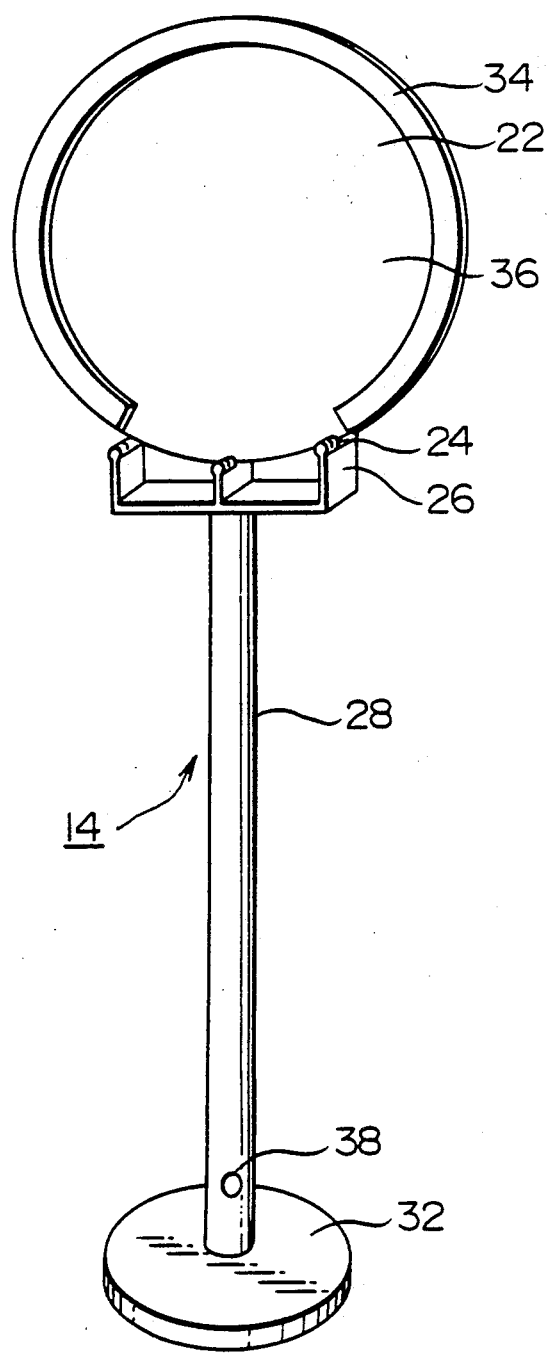
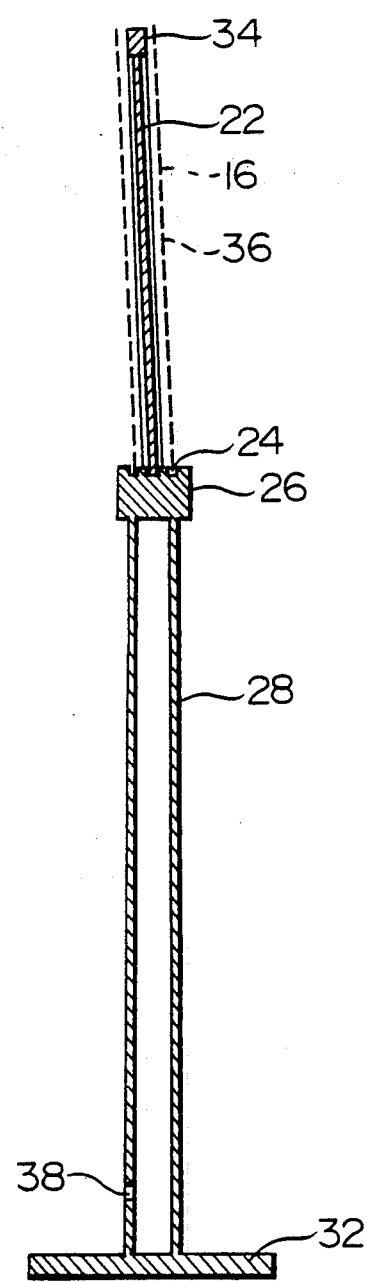

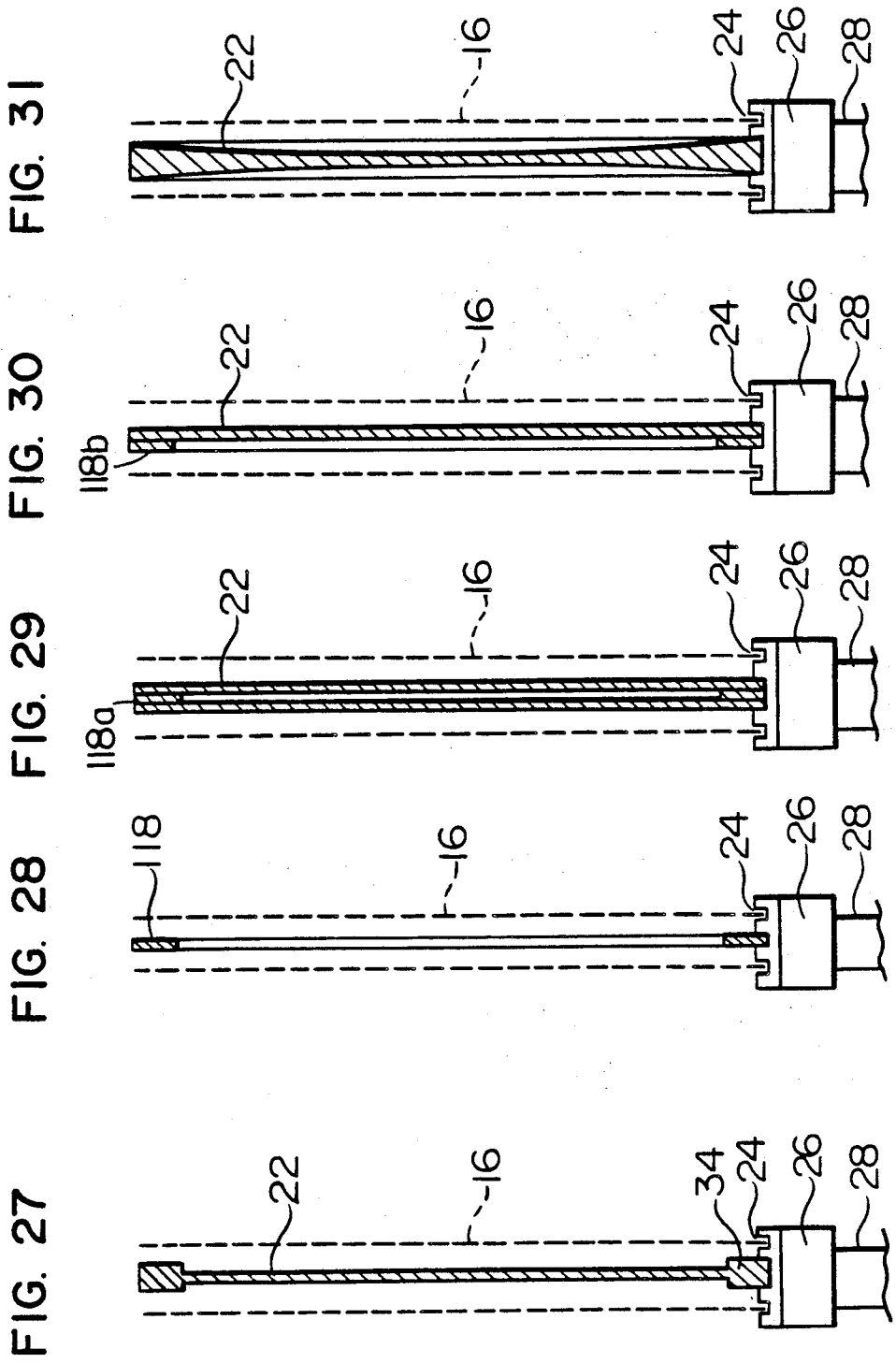

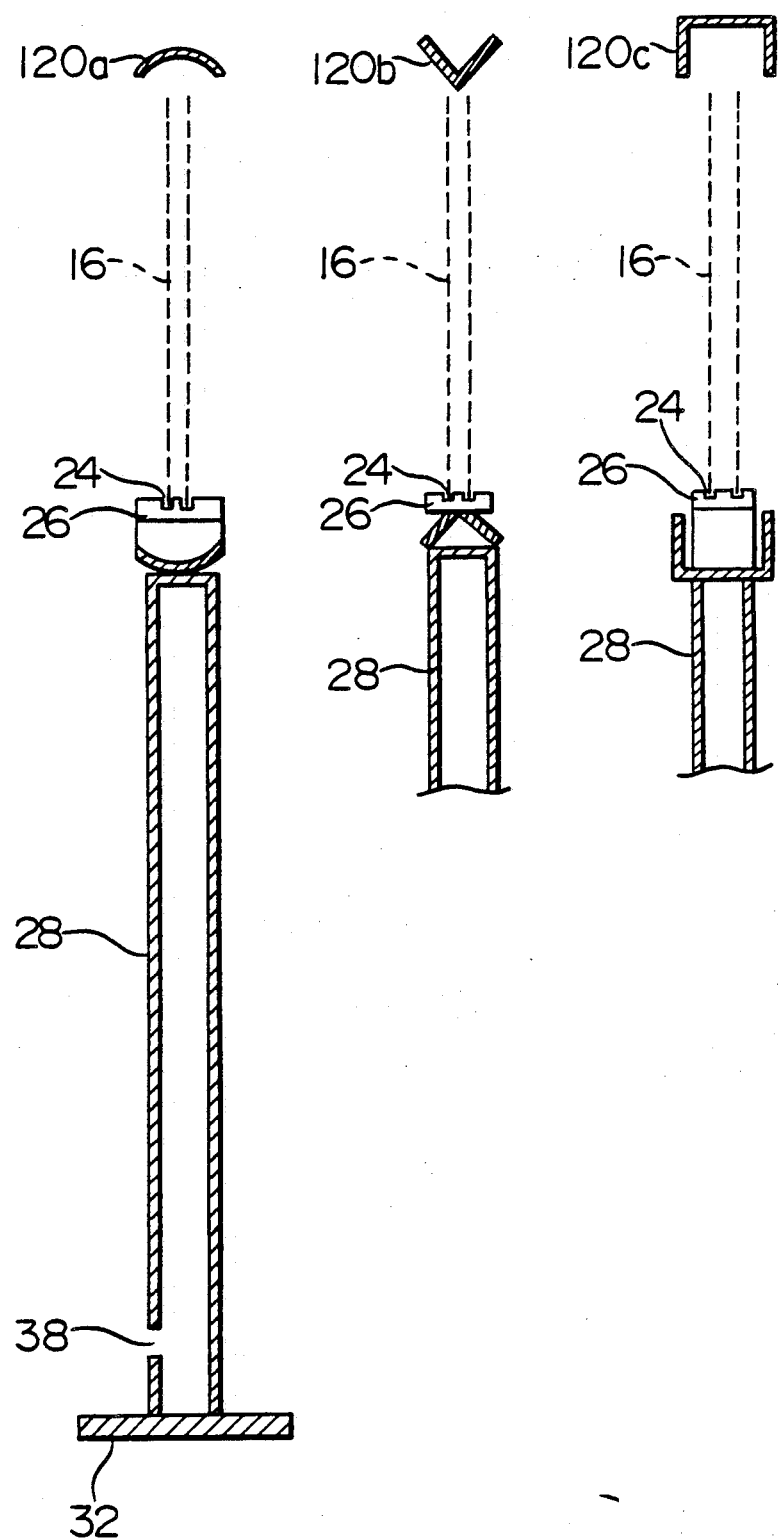

FIG. 36 FIG. 37 FIG. 38
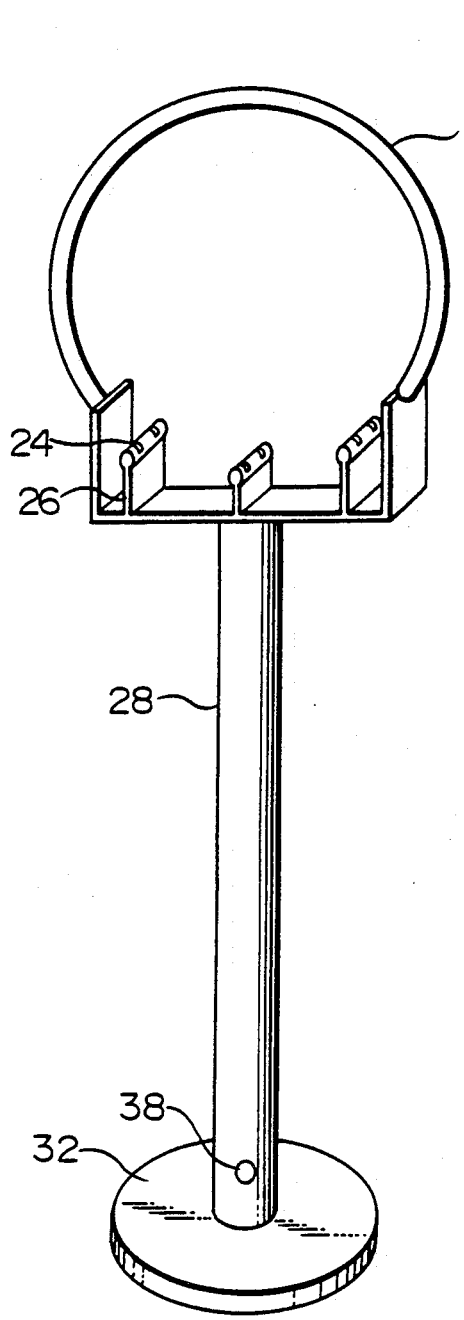
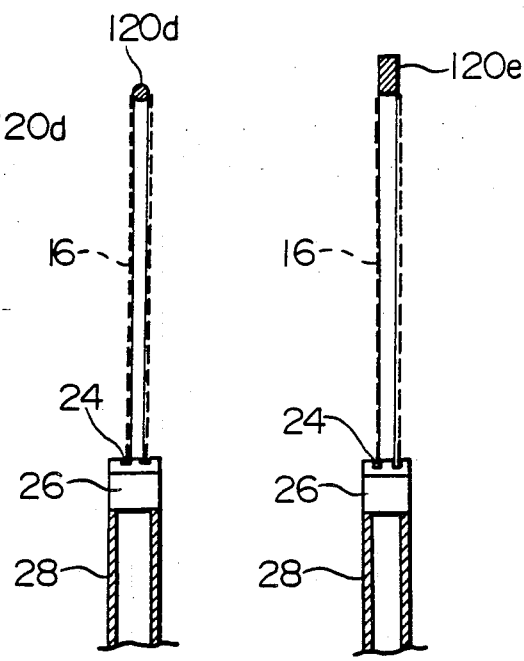
FIG. 39 FIG. 40
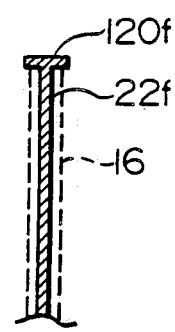
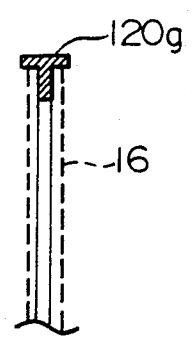

APPARATUS AND METHOD FOR PERFORMING HEAT TREATMENT ON SEMICONDUCTOR WAFERS

BACKGROUND OF THE INVENTION

1. Field of the Invention

The invention relates to heat-treatment of semiconductor wafers such as in the diffusion apparatus and the chemical vapor deposition apparatus, and more particularly to an apparatus and a method of heat-treatment adapted for heat-treating one or two wafers at the same time, with uniformity, in a short time period.

2. Description of the Related Art

In a semiconductor device, the so-called "semiconductor function" is exhibited by introducing a minute amount of atoms of boron, phosphorus arsenic, etc. as impurities in a highly pure solid state substrate, such as a silicon wafer. Impurity atoms are introduced into a substrate in an ion implanting apparatus and then the substrate is heated at 800°–1200° C. for a predetermined time period in an atmosphere of nitrogen gas, argon gas, hydrogen gas etc. in a diffusion apparatus to diffuse the impurity atoms by a predetermined depth with tolerable dispersion and to cure the crystal defects caused by the ion implantation.

Also, in the case of forming an oxide film on a substrate, e.g. a gate oxide film of a MOS transistor or an inter-element isolation oxide film, a substrate is heated in an atmosphere of oxygen gas or steam in a diffusion apparatus to form a thermal oxide film with a tolerable thickness dispersion.

In the heat treatment apparatus used in the conventional diffusion process, a multiplicity of semiconductor wafers are arranged on a quartz boat and are inserted into a horizontally placed cylindrical furnace.

In recent years, it has been desired to form shallow diffusions and thin oxides uniformly over the whole surface of a semiconductor wafer by a short time heating corresponding to the miniaturization of patterns. As a heat treatment apparatus for satisfying such requests, there is proposed a structure, as disclosed in the specification of JP-A-60-171723, in which a vertical cylindrical high temperature furnace has an opening at a lower end and a horizontally supported wafer, one for each time, is inserted into the high temperature furnace from the lower end opening to heat the wafer.

This conventional technique, however, does not permit simultaneously and uniformly heating two wafers in a short time period. Heating the wafers one by one results in poor productivity. If two wafers are to be simultaneously heated, they are placed side by side horizontally. Then, there will be generated very large temperature differences from wafer to wafer and in one wafer. Further, if a wafer is heated for a short time period and rapidly taken out of a high temperature furnace, the very hot wafer will be directly exposed to the external atmosphere and may be contaminated thereby. Yet further, the afore-mentioned technique does not allow for heating a large wafer uniformly, which will be required by recent trend of further scaling down the patterns and employing wafers of a larger diameter.

SUMMARY OF THE INVENTION

An object of this invention is to provide an apparatus and a method for heat-treating semiconductor wafers, capable of successive heating operations of semiconductor wafers uniformly in short time periods, and of performing rapid and uniform cooling of the semiconductor wafers without exposing them to the external atmosphere, thereby performing heat treatment of high quality and high efficiency such as avoiding generation of thermal stress defects in the wafers.

According to an embodiment of this invention, there is provided an apparatus for performing heat treatment on semiconductor wafers, which includes one or plural heating spaces in a high temperature furnace, with heater provided inside the high temperature furnace, said heating spaces have insertion and retrieval openings for semiconductor wafers at a lower portion thereof, and one or two of said wafers are simultaneously loaded and heat-treated in each said heating space.

Said heater may be divided into a plurality of heat generation regions. At least one side surface of each semiconductor wafer loaded in said heating spaces may face said heater and said heat-generation regions corresponding to respective portions of said surface of each semiconductor wafer.

According to the structures as stated above, one or two semiconductor wafers can be simultaneously inserted into and taken out of each heating space from a lower position, heating of the heater in correspondence to the regions in the wafer surface is possible, prevention of generation of thermal stress defects and uniform shortperiod heating are made possible by reduction of temperature distribution in the whole face of successively supplied semiconductor wafers.

BRIEF DESCRIPTION OF THE DRAWINGS

FIG. 4 is a perspective view of a wafer-inserting holder.

FIG. 5 is a longitudinal cross-section of the holder of FIG. 4.

FIGS. 27 to 31 are longitudinal cross-sections of wafer loading portions of wafer inserting holders according to other embodiments of this invention.

FIGS. 33 to 35 are longitudinal cross-sections of wafer-loading portions of wafer-inserting holders according to other embodiments of this invention.

FIG. 36 is a perspective view of a wafer-inserting holder according to another embodiment of this invention.

FIG. 37 is a longitudinal cross-section of the wafer-inserting holder of FIG. 36.

FIGS. 38 to 40 are longitudinal cross-sections of wafer-inserting holders according to other embodiments of this invention.

DESCRIPTION OF THE PREFERRED EMBODIMENTS

Figure 1:
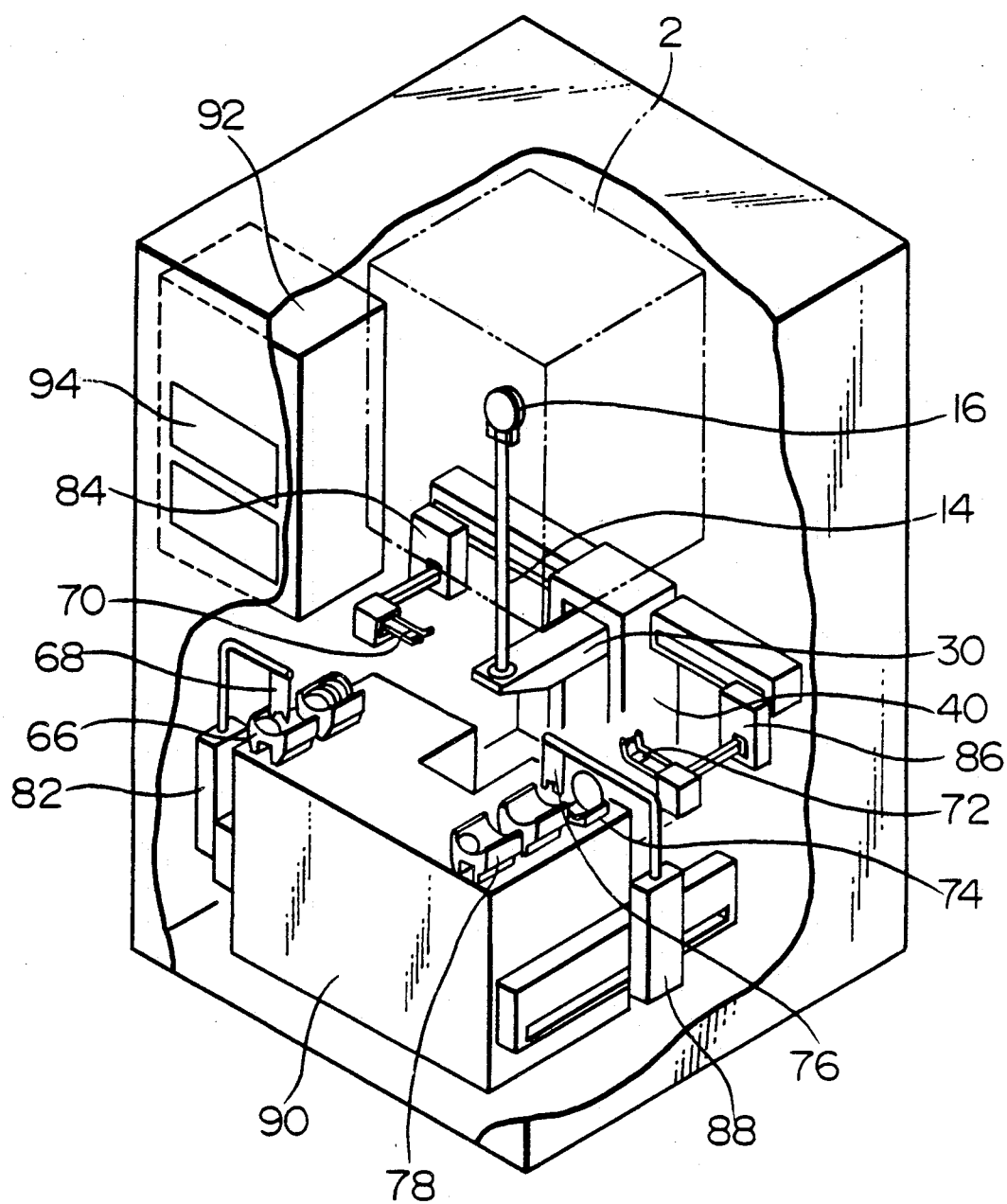
FIG. 1 is a general schematic perspective view of a diffusion apparatus according to an embodiment of this invention.

Now, embodiments of this invention will be described referring to the drawings.

FIG. 1 shows a general view of the structure of a diffusion apparatus to which this invention is applied.

Figure 2:
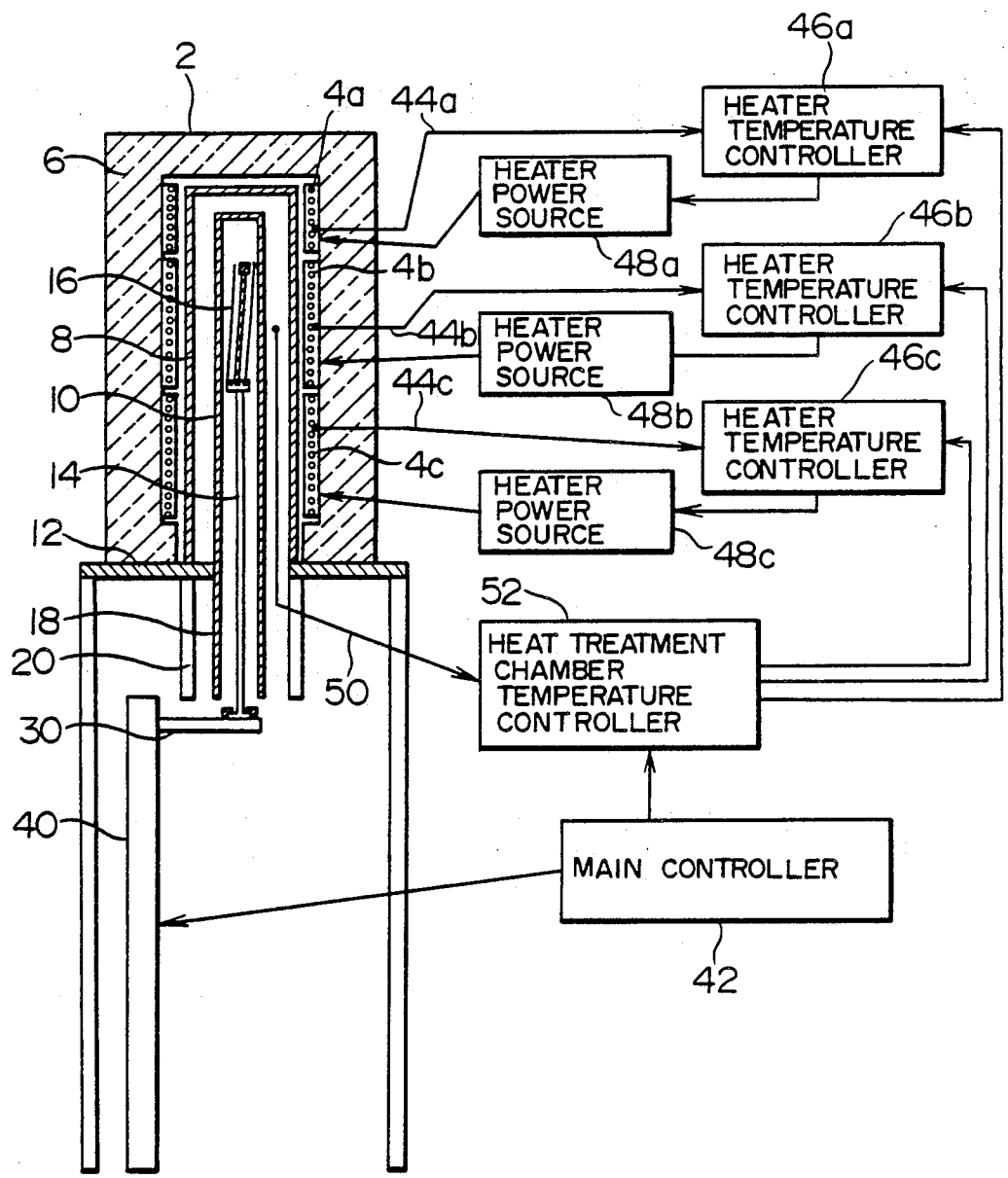
FIG. 2 is a longitudinal cross-section of a high temperature furnace and a block diagram of a temperature control system.
Figure 3:
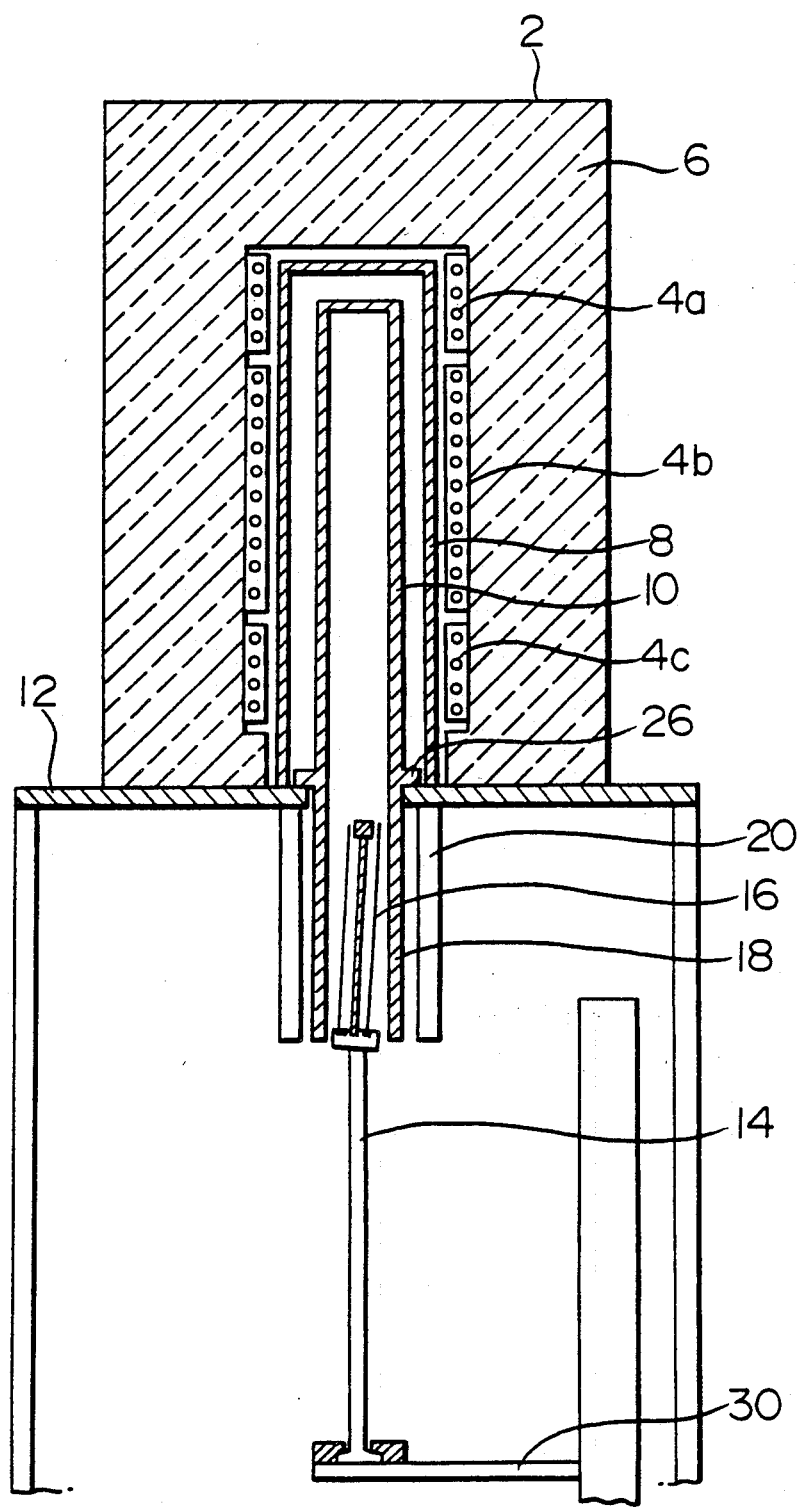
FIG. 3 is a longitudinal cross-section of a high temperature furnace.

FIGS. 2 and 3 show longitudinal cross-sections of a high temperature furnace 2 and a block diagram of a control system for the apparatus of FIG. 1. Referring to FIGS. 2 and 3, the high temperature furnace 2 has a rectangular shape. A heat insulating member 6 is provided around a pair of right and left plate shaped heaters 4a, 4b and 4c (which may be formed of folded iron-chromium-aluminum alloy (Kanthal) resistance heater sheet embedded in an alumina heat insulator member, etc.), each of which is divided into a plurality of heat generating domains. Inside the heater, there are provided a linear tube 8 (made of silicon carbide etc.) and a process tube 10 (made of quartz glass, etc.), which are supported by a flange 12 (made of stainless steel etc.) and constitute the high temperature furnace 2.

From the underside of the high temperature furnace 2, a pair of wafers 16 mounted on a wafer-inserting holder 14 are inserted almost vertically into the inside of process tube 10. The lower part 18 of the process tube 10 extends below the high temperature furnace 2, and is surrounded by a cooling member 20 (such as a plate in which coolant fluid is allowed to flow).

FIG. 4 is a perspective view of a wafer-inserting holder. FIG. 5 is a longitudinal cross-section of the wafer-inserting holder shown in FIG. 4.

The wafer-inserting holder 14 comprises a disk 22 to intervene between a pair of wafers, a top end portion 26 having grooves 24 for accommodating the disk 22 and wafers 16, a support pillar 28 of a thin wall pipe shape, and a flange 32 for mounting the holder on an elevating carrier 30. The disk 22 has a greater thickness at its circumferential portion 34 than at its central portion 36, except a lower portion, and has a diameter equal to that of the wafers 16. The top end portion 26 is formed of thin plates and shaped of circular rods at the portions having the grooves 24. The support pillar 28 has a gas communication hole 38 at a lower position and a hermetic structure else where.

The wafer-insertion holder 14 may be made of quartz glass, polycrystalline silicon, silicon carbide, etc. The disk 22 and the support pillar 28 may be made of different materials. Further, those composite materials which are made by coating a polycrystalline silicon film, a silicon nitride film, etc. on a quartz glass member may also be used.

Typical dimensions of the wafer-inserting holder 14 will be shown hereinbelow. In case of heat-treating a pair of wafers each having a diameter of 150 mm and a thickness of 0.6 mm, the disk 22 has an outer diameter of 150 mm, a thickness of 1 mm at the central portion 36 and a thickness of 2 mm at the peripheral portion 34, with a width of 8 mm from the circumference for the thick peripheral portion. The gap between each of the wafers 16 and the thick portion 34 of the disk is designed at 2.5 mm. The top end of the holder having the grooves 24 is formed of circular rods of a diameter of 5 mm. Each of the grooves 24 for accommodating the wafers has a width of 0.7 mm, and a depth of 2.5 mm with rounded corners in the groove. The plate members of the top end portion 26 and the pipe of the support pillar 28 have a thickness of 1.5 mm.

The grooves 24 are so designed that a pair of wafers 16 and the disk 22 is slanted by 5 degrees from the vertical position and become parallel to each other when accommodated on the top end portion 26. The reason for having the wafers slanted is to avoid vibrations of wafers in the horizontal direction when the insertion holder 14 is transferred vertically. Since the slant angle is small, there is almost no difference in the heat transfer characteristics between the pair of wafers in heating in the high temperature furnace and in cooling in a cooling zone even with the wafers slanted.

The up/down carrier 30 is mounted on an up/down drive mechanism 40 in which ball screws etc. are installed. Control signals are given from a main controller 42 to the up/down drive mechanism 40.

Heat generating portion temperature measuring sensors 44a, 44b and 44c are inserted in the respective divided heater regions 4a, 4b and 4c. The amount of heat generation is controlled by heater temperature controllers 46a, 46b and 46c, of PID thyristor control type, and heater power sources 48a, 48b and 48c so that the heat generating portion temperatures at respective heater regions approach given set temperatures.

A heat treatment chamber internal temperature sensor 50 is inserted at a wafer insertion position between the process tube 10 and the linear tube 8 and is connected to a heat treatment chamber temperature controller 52. In the heat treatment chamber temperature controller 52, operation processing as described later is performed to give set temperatures to the heater temperature controllers 46a, 46b and 46c. The heat treatment chamber temperature controller 52 accepts status signals, such as commencement of wafer insertion, from the main controller 42.

Figure 6:
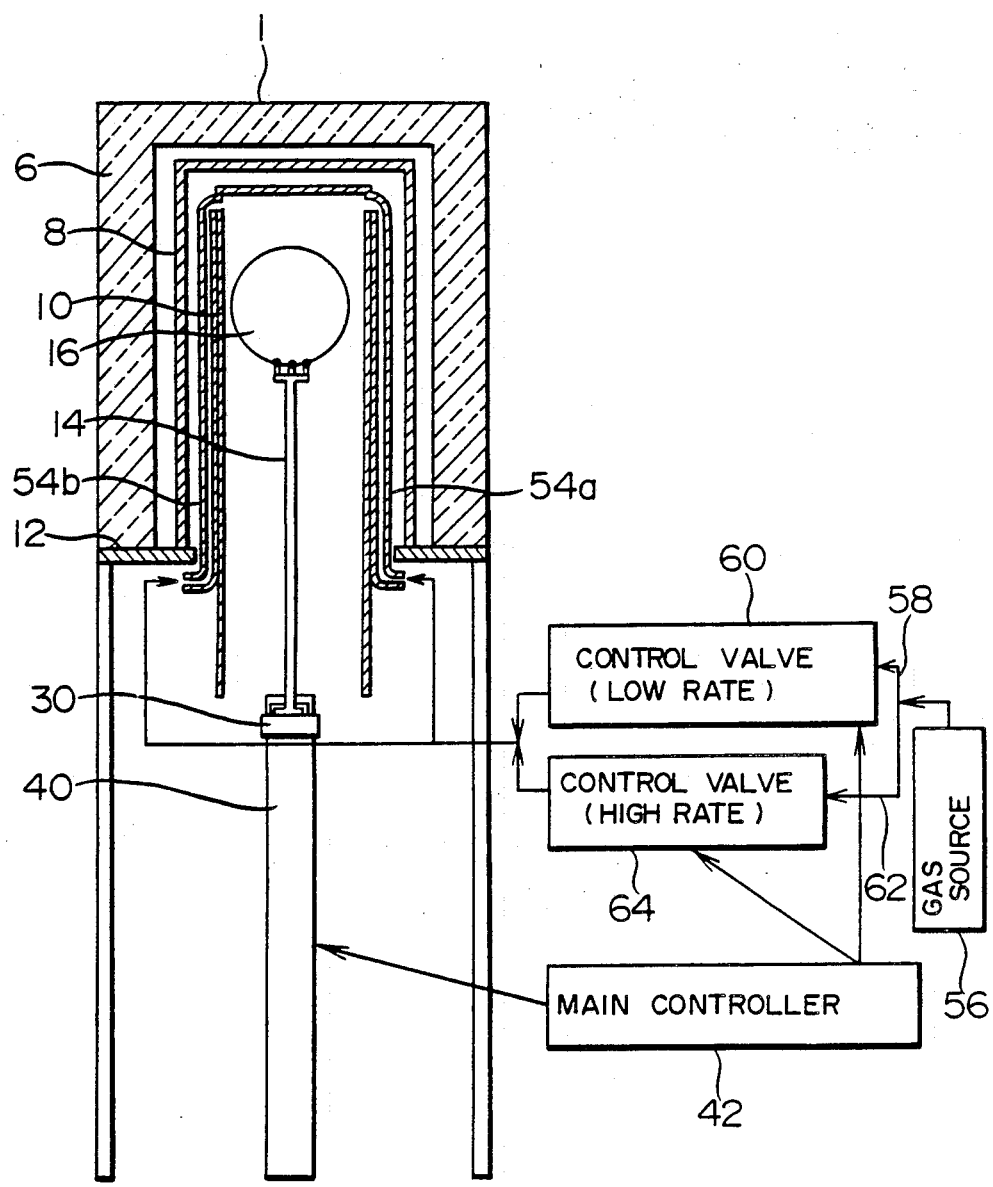
FIG. 6 is a longitudinal cross-section of the high temperature furnace along a direction perpendicular to that of FIG. 2 and a block diagram of an associated control system.
Figure 7:
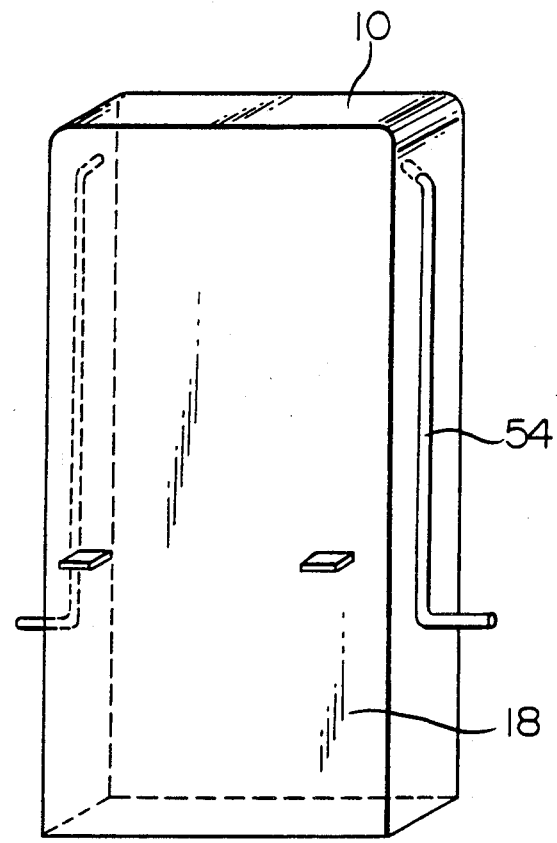
FIG. 7 is a perspective view of a process tube.

FIG. 6 shows a longitudinal cross-section of the high temperature furnace along a surface perpendicular to that of FIG. 2 and a control system. FIG. 7 is a perspective view of the process tube 10. In the process tube, a gas such as nitrogen, argon, oxygen, water steam, selected in dependence on the intended use of the diffusion apparatus, is pre-heated, supplied, and allowed to flow from the top to the bottom of the process tube 10, i.e. downwards. On the left and right sides of the process tube 10, gas supply tubes 54a and 54b are provided. Gas supplied from a gas source 56 is guided to the gas supply tubes 54a and 54b through either a path of a low rate piping system 58 and a control valve 60 or a high rate piping system 62 and a control valve 64. That gas is preheated while flowing upward in the gas supply tubes 54a, 54b outside the process tube 10 and is fed into the inside of the process tube 10 at the upper portion thereof. Control valves 60 and 64 are open/close controlled by signals from the main controller 42 to control the gas flow rate large or small.

Figure 8:
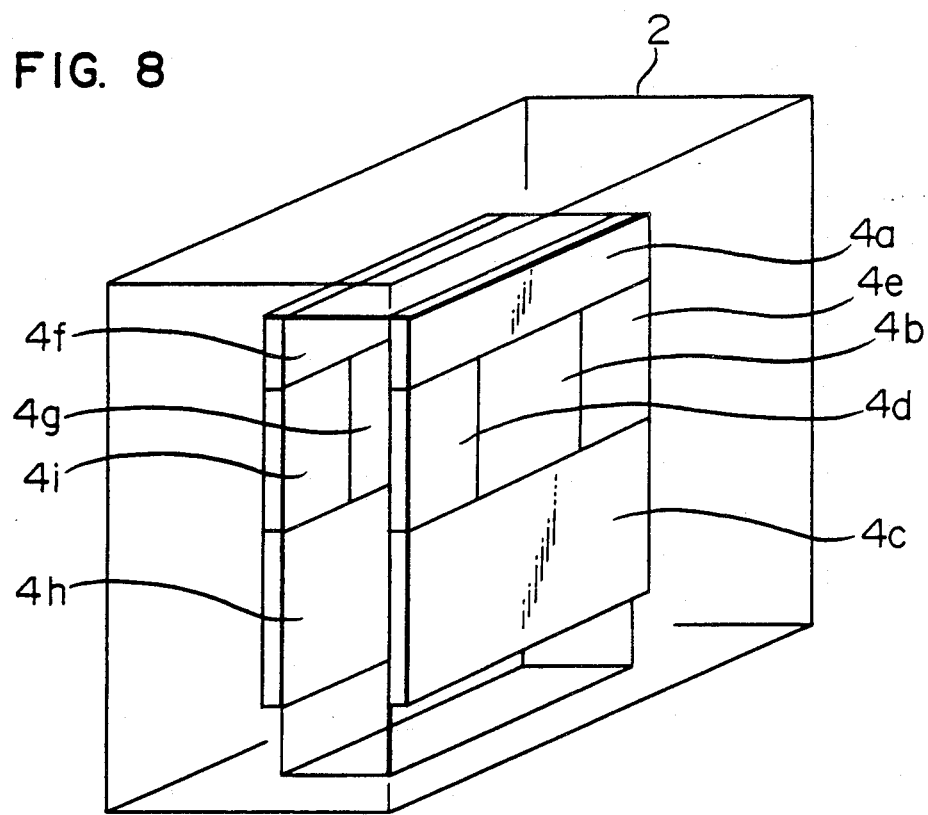
FIG. 8 is a perspective view of an example of the high temperature furnace showing a divided heater region arrangement.

FIG. 8 is a perspective view of a high temperature furnace 2 showing division of the heater. The heater comprises two parallel plates, each being divided into five regions 4a to 4j. From the front-rear and right-left symmetry, four heat generations areas, central (4b and 4g), upper (4a and 4f), lower (4c and 4h) and side (4d, 4e, 4i and 4j) are controlled independently.

Corresponding to the four heat generation areas of the heater, the heater temperature controllers 46a to 46d, the heater power sources 48a to 48d, and the heat generation portion temperature measuring sensors 44a to 44d are divided into four independent systems. For keeping the symmetry of front-rear or right-left relation, the heater division of front-rear and right-left are controlled to always generate the same amount of heat.

In the manufacture of the heater, the resistance values of the regions in the symmetry positions may vary to some extent. Adjustment may be made by attaching adjusting resistors to the external wiring system.

Figure 9:
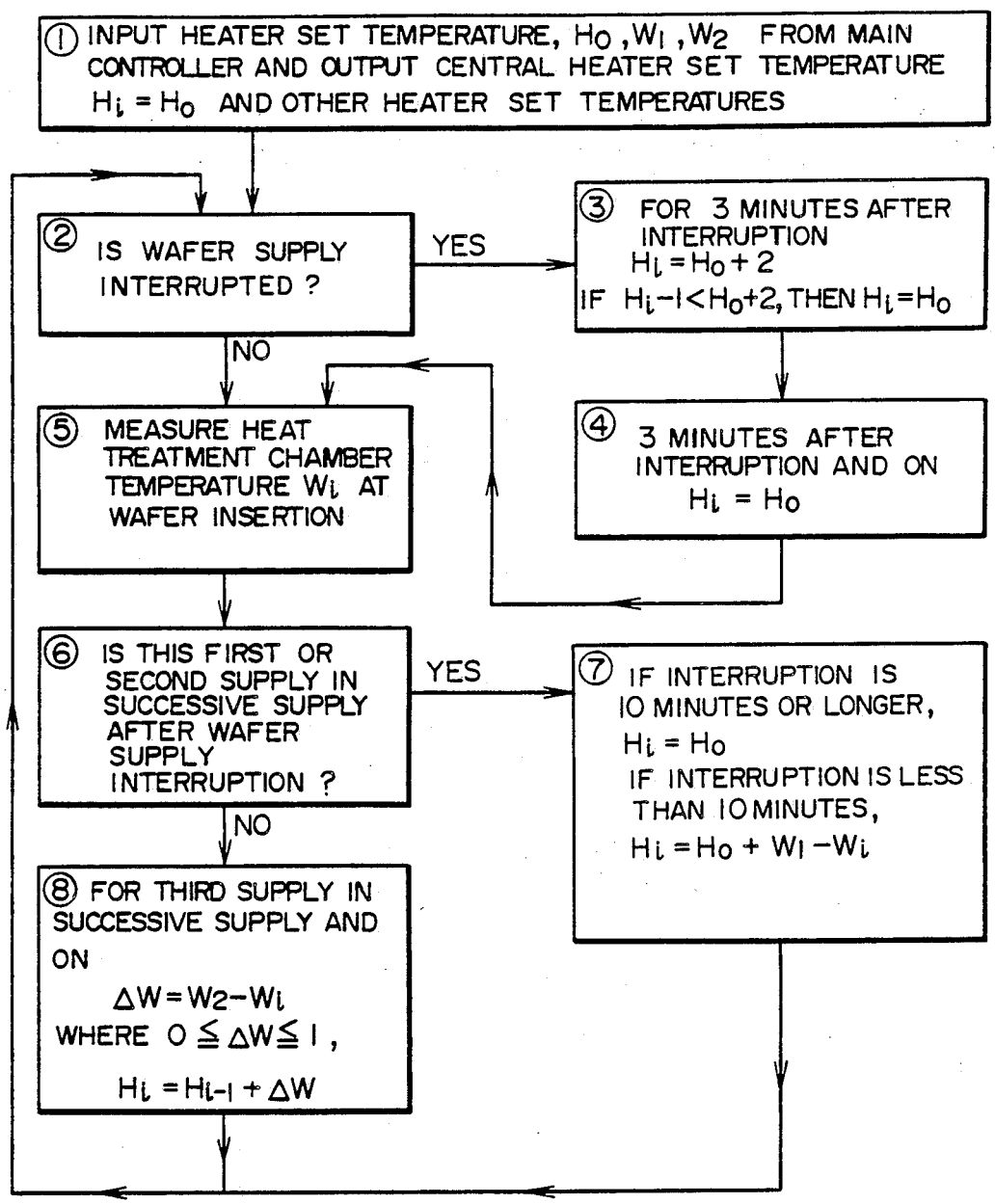
FIG. 9 is a flow chart of an operation process in the temperature controller of the heat treatment chamber.

FIG. 9 is a flow chart of the operation process to be achieved with the heat treatment chamber temperature controller 52. Regarding the heaters 4b and 4g in the central region, let the set temperature of the heater temperature controller upon the i-th wafer insertion be denoted as Hi, the previous set temperature therebefore be denoted as $H_{i-1}$, the set temperature in the steady state without wafer insertion be denoted as $H_o$, the internal temperature of the heat treatment chamber in the steady state be denoted as $w_1$, the internal temperature of the heat treatment chamber immediately before the i-th wafer insertion be denoted as $w_i$, and the internal temperature of the heat treatment chamber immediately before the second insertion be denoted as $w_2$.

In FIG. 9, ① when the heater is turned on, $H_o$, $w_1$ and $w_2$ and the set temperatures for the respective heater temperature controllers are inputted from the main controller, and a signal of the set temperature of central region $H_i = H_o$ is outputted to the heater temperature controller 46b for the central region. Together with this, set temperatures of other regions are outputted to the heater temperature controllers for the other regions. Here, the values of $H_o$, $w_1$, and $w_2$ and the respective heater set temperatures are preliminarily obtained from experiments for each heat treatment condition and stored in the main controller. When the successive supply of the wafers is started, ⑤ the internal temperature wi of the heat treatment chamber immediately before the wafer insertion is measured. ⑥ For the first and the second of the successive insertions, ⑦ the set temperature $H_i$ is outputted to the heater temperature controller for the central region in accordance with the interruption time of the wafer insertion. ⑧ For the third and on of the successive insertion, the set temperature of the heater for the central region is corrected by $\Delta w = w_2 - w_i$ so that the internal temperature $w_i$ of the heat treatment chamber immediately before the wafer insertion approaches the value $w_2$ immediately before the second insertion. ② When the wafer insertion is interrupted, ③ the heater set temperature for the central region set $H_o + 2°$ C. for 3 minutes after the interruption. Here, however, if the set temperature theretofore $H_{i-1}$ is below $H_o + 2$, the set temperature is set at $H_o$. ④ After three minutes have passed from the interruption, the heater set temperature for the central region is made equal to $H_o$, to wait the re-start of the wafer supply.

The reason why the heater set temperature for the central region is set to $H_o + 2$ for 3 minutes after the interruption of the wafer insertion ⑧ in of FIG. 9 is to avoid a rapid change of the heater set temperature. Also, the reason why the correction $\Delta w$ of the heater set temperature in ⑧ successive insertion is in the range 0°–1° C. is to avoid having the correction become very large when the internal temperature sensor 50 of the heat treatment chamber exhibits an abnormal value due to noise.

The control of the heater set temperature in FIG. 9 is done only for the central heater regions 4b and 4g, with other heater regions 4a, 4c to 4f, and 4h to 4j kept at constant set temperatures. The reason for this is that the central heater region is cooled by the insertion of a room temperature wafer or wafers, but other heater regions are not cooled thereby.

Figure 10:
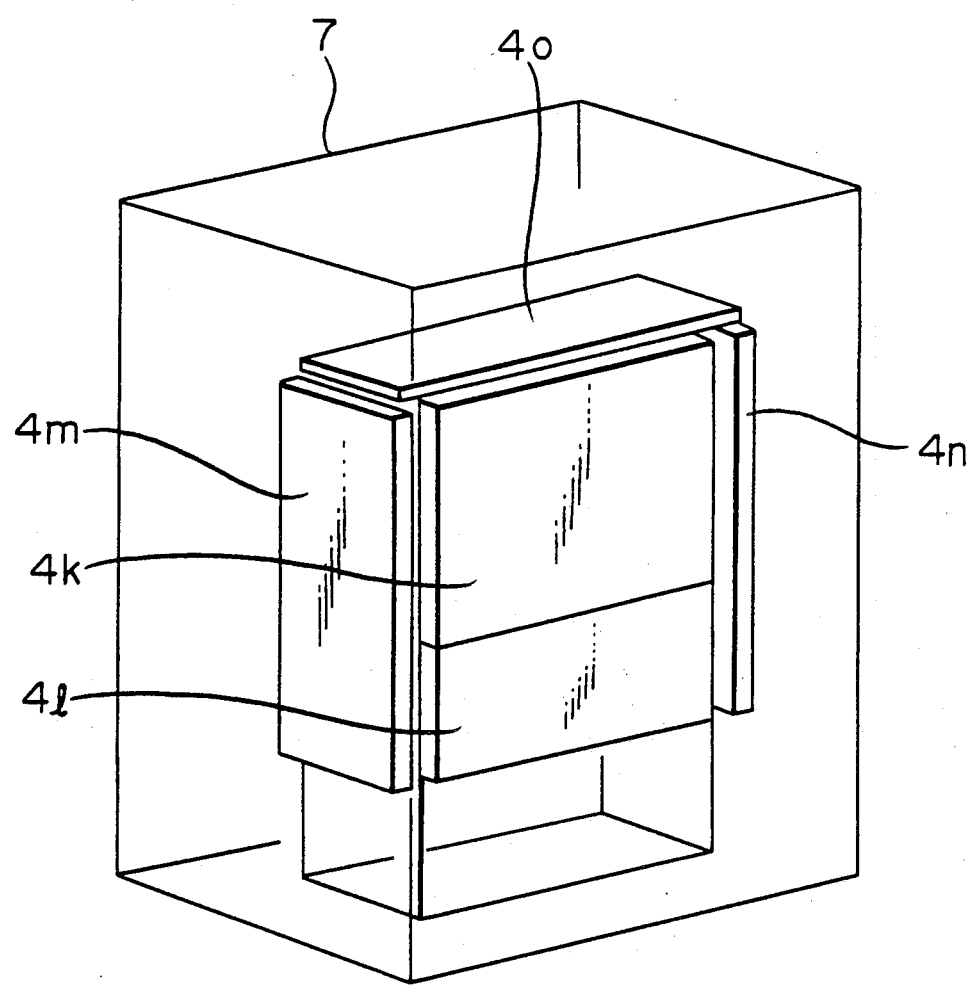
FIG. 10 is a perspective view of another example of the high temperature furnace showing another divided heater region arrangement.

FIG. 10 shows another example of the high temperature furnace 2 illustrating division of the heater. The heater is divided into an upper heater 4k and a lower heater 4l, both disposed substantially parallel to the wafer plane, side heaters 4m and 4n, and a top plane heater 4o, all of which are controlled independently. This embodiment has a lower number of divisions compared to the embodiment of FIG. 8 and still can provide similarly uniform heat treatment.

Figure 11:
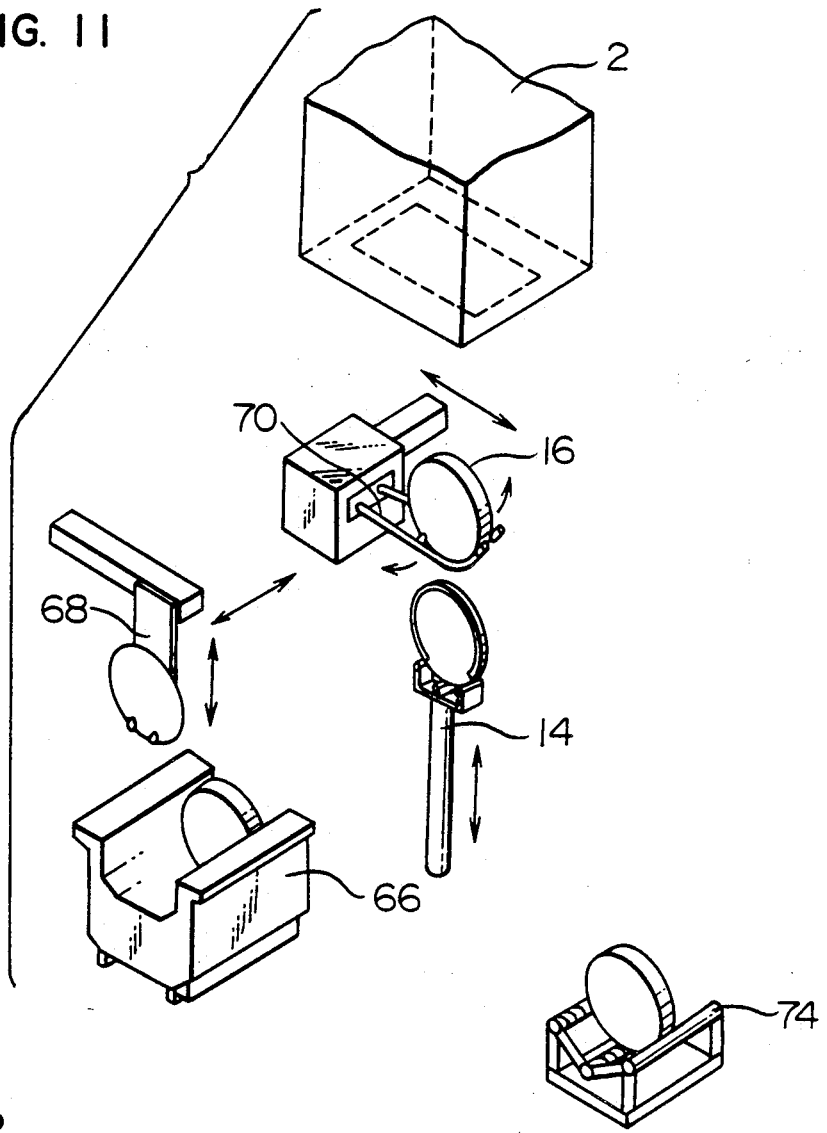
FIG. 11 is a perspective view of main parts of a wafer supply mechanism.

FIG. 11 is a perspective view of main parts of the wafer supply mechanism. All the parts are shown in FIG. 1.

The wafer supply mechanism comprises a cassette 66 for containing pre-treatment wafers, a take-out holder 68, a load holder 70, an insertion holder 14, an unload holder 72, a cooling boat 74, a put-in holder 76, a cassette 78 for containing post-treatment wafers, etc. Arrows in FIG. 11 indicate the directions of motion of the respective holders. The unload holder 72 has the same structure as the load holder 70. These holders 72 and 70 are provided in right and left opposing positions with respect to the insertion holder 14. The put-in holder 76 has the same structure as the take-out holder 68.

Figure 12:
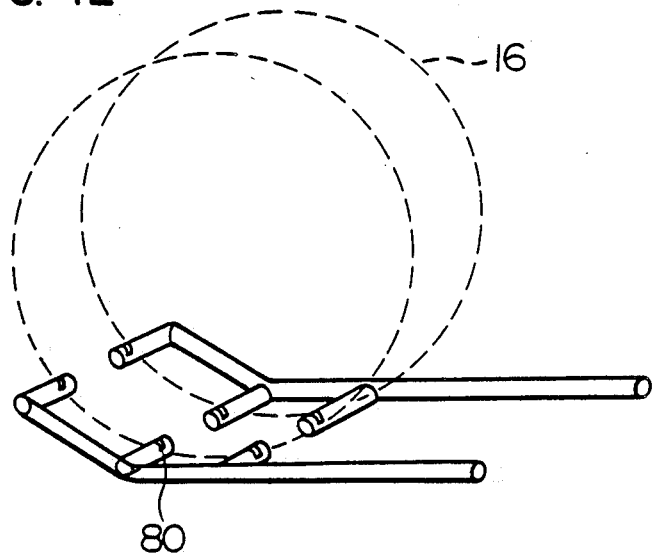
FIG. 12 is a perspective view of a loading holder and an unloading holder.

FIG. 12 is an exterior view of a top end portion of the load holder 70 and the unload holder 72. It is comprised of round rods (e.g. made of quartz glass) having grooves 80 for accommodating wafers. For keeping away from or allowing passage of the disk 22 of the insertion holder 14, the two wafers are supported separately.

As shown in FIG. 1, the system has a drive section 82 for the take-out holder 68, a drive section 84 for the load holder 70, a drive section 86 for the unload holder 72, and a drive section 88 for the put-in holder 76. The power sources for these drive sections are contained in a box 90 together with the heater power source transformer, etc. The control instrument 92 such as the main controller 42 has a control panel 94 of display panels and switches at the front face. Although not shown in the figure, there are provided sensors for sensing whether there is any wafer in the cassettes 66 and 78 and the cooling boat 74, and sensors for sensing whether any wafer is being supported by the respective holders 14, 68, 70, 72 and 76. Also, there are provided position detection sensors for the respective holders 68, 70, 72, and 76. Since wafers are placed on the insertion holder 14 with a slight slant, the cassettes 66 and 78, the cooling boat 74 and the respective holders 68, 70, 72 and 76 are a little slanted from the vertical state.

Figure 13:
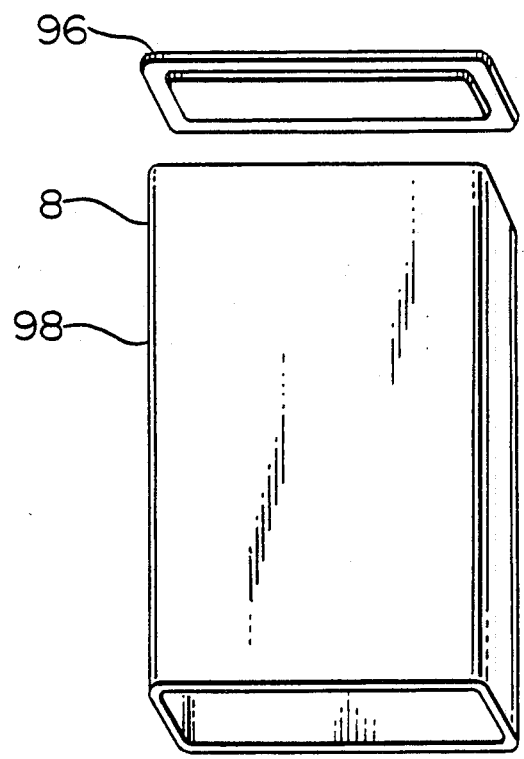
FIG. 13 is a perspective view of a linear tube.

FIG. 13 shows an exterior view of the linear tube 8. The tube 8 comprises a cap 96 and a main body 98. The main body 98 has rounded corners for increasing its strength.

Figure 14:
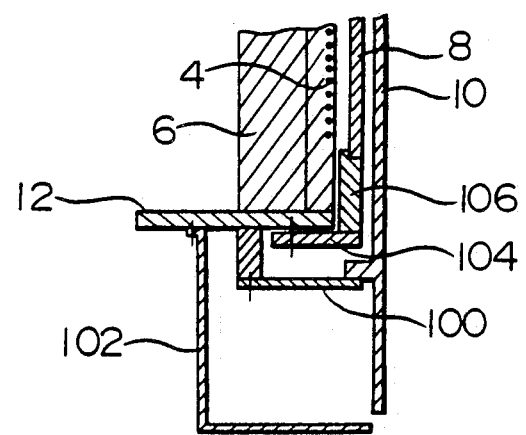
FIG. 14 is a longitudinal cross-section showing how parts of a lower portion of a high temperature furnace are assembled.

FIG. 14 is a cross-section of details of the parts for assembling the process tube 10, the linear tube 8, the heater 4, and the heat-insulating member 6 to the flange 12. The process tube 10 should be frequently detached for the purpose of cleaning. To make the detachment easy, the process tube 10 is fixed to the flange 12 with screws and a fixing metal member 100. The linear tube 8 is also arranged to be detachable from the high temperature furnace 2 for the purpose of maintenance. The lower part of the high temperature furnace 2 is surrounded with scavenger 102. The scavenger 102 also works as a cooling member, and guides the treatment gas and dusts ejecting from the process tube to the exhaust system. A heat-insulating member 106 (e.g. made of ceramics, etc.) is provided between the linear tube 8 and the screws and a fixing metal member 104 to enhance reduction of the heat dissipation.

Processes for conducting heat treatment on the wafers using the diffusion apparatus as constructed above will be described hereinbelow. An operator inputs the heat treatment conditions (objective heat treatment temperature time period, kind of gas, etc.) into the main controller 42. For example, let the input information be 1000° C., 3 minutes and nitrogen. The main controller 42 transmits this informations to the heat treatment temperature controller 52. The heat treatment temperature controller 52 gives heater set temperatures to the heater temperature controllers 46a to 46d for the respective heater regions. The set temperatures for the lower heater regions 4c and 4h are fixed at higher temperatures compared to the central heater regions 4b and 4g, to cancel the heat dissipation from the lower inlet of the high temperature furnace 2 and the influences of the insertion holder 14. For example, when the set temperature of the central heater regions 4b and 4g is set at 1000° C., the set temperature for the lower heater regions 4c and 4h will be set at 1060° C. The set temperatures of the upper and the side heater regions 4a, 4d, 4e, 4f, 4i and 4j are so selected as to make the heat treatment of the wafer uniform. For example, the set temperature of the upper heater regions 4a and 4f is set at 990° C., and the set temperature of the side heater regions 4d, 4e, 4i and 4j is set at 980° C. The reason for selecting the set temperatures for the upper and the side heater regions a little lower than that of the central heater region is that when a pair of wafers are simultaneously inserted into the heat treatment chamber, the peripheral portion of the wafer is more heated by the heat from the side portion than the central portion of the wafer and hence the temperatures of the upper and the side regions should be held a little lower than the central region for heat-treating the wafer uniformly. Under these heater set temperatures, wafer supply is commenced after the internal temperature of the heat treatment chamber becomes steady. Here, until the wafer supply is started, the insertion holder 14 is kept in the heat treatment chamber and is pre-heated.

When an operator sets a cassette 66 carrying wafers and an empty cassette 78 in the equipment and inputs the signal for starting the heat treatment from the control panel 94 to the main controller 42, signals from the main controller 42 cause the take-out holder 68 to take out the wafers one by one from the cassette 66 and to carry a pair of wafers to the load holder 70. Then, signals from the main controller 42 go to the up/down drive mechanism 40 to move the insertion holder 14 below the high temperature furnace 2. The load holder 70 is actuated to load a pair of wafers on the insertion holder 14. After loading the wafers on the insertion holder 14, the load holder 70 opens its top ends, returns to the original position, receives the next pair of wafers which are transferred by the take-out holder 68, and waits for the next action.

The insertion holder 14 moves upwards and positions the wafers 16 in the heat treatment chamber (see FIG. 2). For preventing occurrence of a temperature distribution in the wafers upon insertion, the insertion speed is selected at a high speed, e.g. at 150 mm/sec or more. For preventing any excess external atmosphere from being brought into the heat treatment chamber with the insertion of the wafers, signals are sent from the main controller 42 to the control valves 60 and 64 to increase the flow rate of the gas. The wafers 16 are held in the heat treatment chamber and are heated for a predetermined time period. The gas flow during the heat treatment may be small, and hence signals from the main controller 42 cause the control valves 60 and 64 to make the flow rate small. Here, depending on the heat treatment conditions, the species of gas may be changed at the time of insertion and retrieval and at the time of heat treatment. For example, nitrogen gas may be used upon insertion and retrieval while oxygen gas may be used upon heat treatment.

When the heat treatment is finished, signals from the main controller 42 cause the insertion holder 14 to go downwards and position the wafers between cooling members 20 below the high temperature furnace (see FIG. 3). After the wafers are cooled for a predetermined time period between the cooling members 20, the insertion holder 14 moves further down to take out the wafers.

The transfer or moving speed of the wafers is selected at a similarly high speed as the insertion speed to prevent a temperature distribution in the wafer plane when the holder is moved downwards. For preventing any excess external atmosphere from mixing into the heat treatment chamber, the flow rate of the gas is kept at the low value, as will be described later. The wafers taken out just below the high temperature furnace are cooled for a predetermined time period on the insertion holder, then are taken out by the unload holder 72, carried to the cooling boat 74 by the put-in holder 76, and cooled thereat. During these actions, a new set of wafers are put on the insertion holder 14 by the load holder 70 and repeat the above-mentioned operations. The wafers sufficiently cooled down in the cooling boat 74 are put in the cassette 78 by the put-in holder 76.

Regarding the cooling time period, to prevent the insertion holder 14 from being excessively cooled during unloading and loading operations, the cooling time period for the wafers between the cooling members 20 is selected to be for example 10 seconds, the cooling time of wafers on the insertion holder just below the high temperature furnace is selected to be for example 10 seconds, and the unload and load times may be, for example, 20 seconds.

Each time a new set of wafers are inserted, the set temperature of the central heater region is changed and the heat treatment of the wafers is achieved uniformly according to the flow chart of FIG. 9. When the wafer supply is interrupted, a sensor or sensors (not shown) sense the absence of any new wafer on the load holder, and then the insertion holder without any wafer disposed thereon is kept in the heat treatment chamber and waits the next action.

Figure 15:
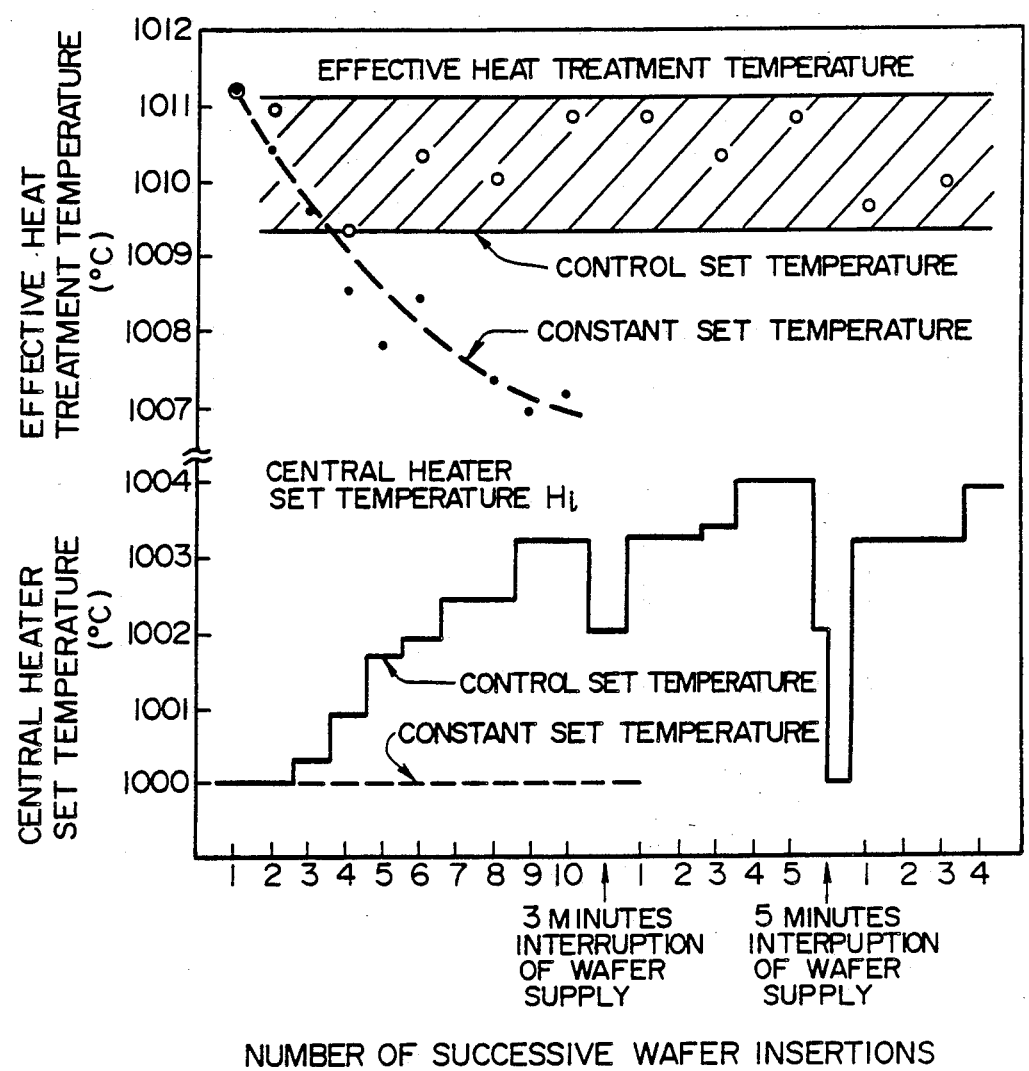
FIG. 15 is a graph of experimental results showing change in the effective heat treatment temperature and the heater set temperature for respective numbers of insertions.

FIG. 15 shows the experimental results on the variation of the effective heat treatment temperature and the set temperature Hi of the central heater region for respective members of insertions when the control of the heater set temperature is conducted according to the flow chart shown in FIG. 9. The effective heat treatment temperature is derived by measuring the transient changes in the wafer temperature (by using a radiation thermometer, as described later, as a measuring instrument), and integrating the wafer temperature with a weight of the diffusion speed of impurities in the silicon substrate (in the case of FIG. 15 the impurity being arsenic) to obtain an averaged wafer temperature during the heating period. FIG. 15 also shows in a broken line the change of the effective heat treatment temperature when the control of the heater set temperature is not performed and the heater set temperatures are kept at constant values. When the heater set temperatures are kept constant, the internal temperature of the heat treatment chamber will decrease at each wafer insertion, and the effective heat treatment temperature of the wafer will also decrease. By controlling the heater set temperatures, the effective heat treatment temperature of the wafer can be kept substantially constant for the respective number of wafer insertions.

Figure 16:
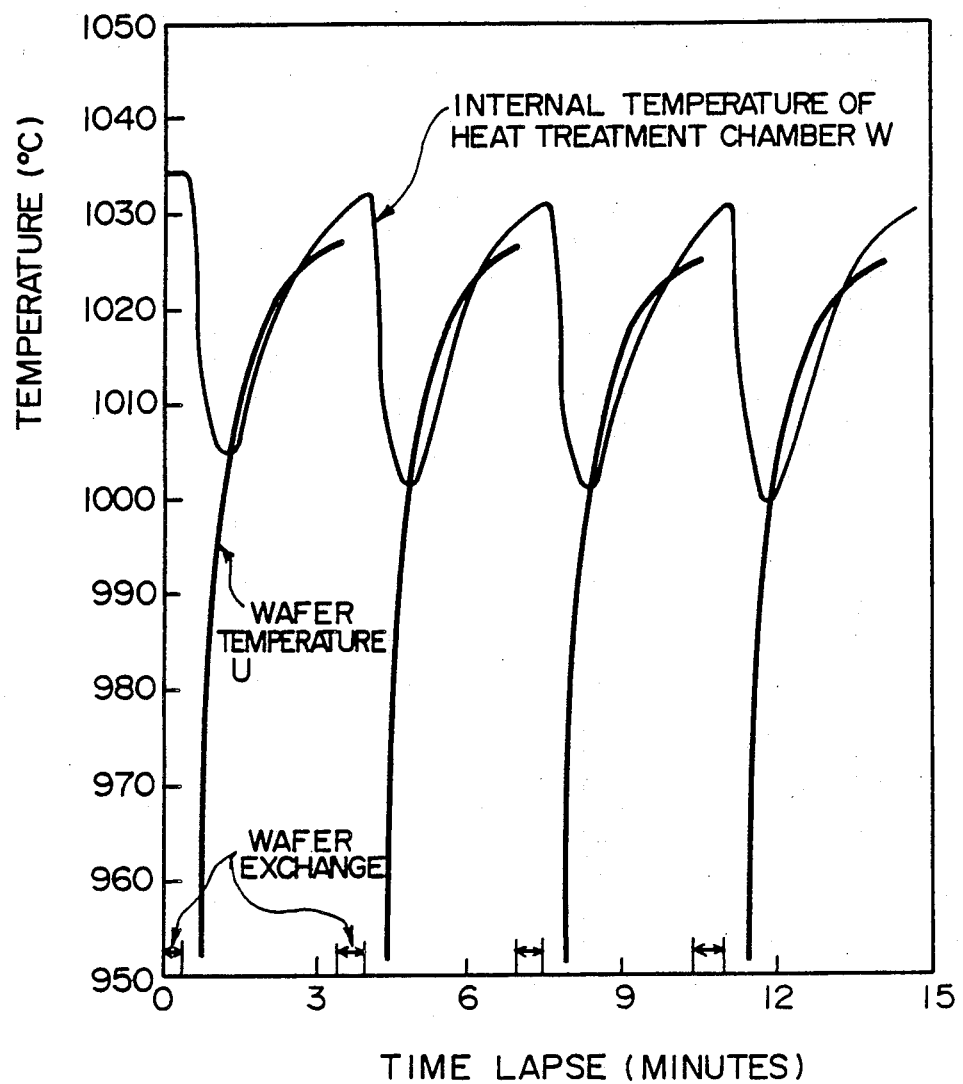
FIG. 16 is a graph of experimental results showing time dependence of the inner temperature of the heat treatment chamber and the wafer temperature.

FIG. 16 shows the experimental results on the time dependence of the internal temperature w of the heat treatment chamber and the wafer temperature U. The heat treatment chamber temperature once decreases upon insertion of low temperature wafers, and then gradually increases. It can be seen that the wafer temperature does not become a steady temperature within 3 minutes or so.

Figure 17:
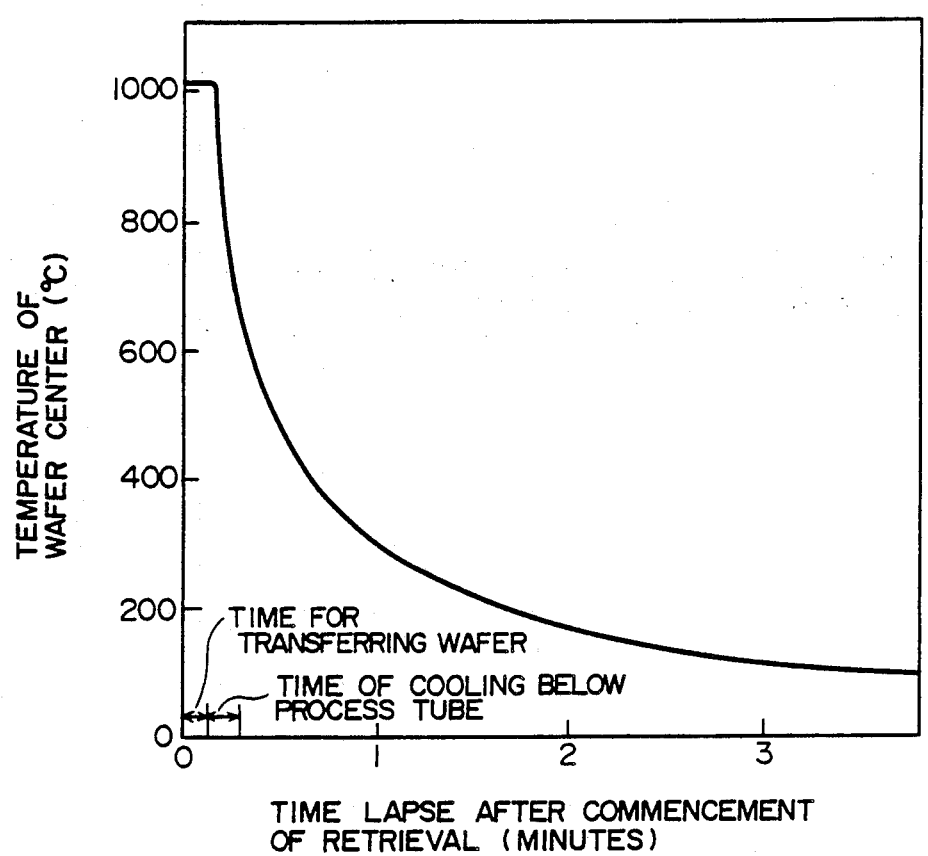
FIG. 17 is a graph of experimental results on the wafer cooling characteristics.

FIG. 17 shows the experimental results on the cooling characteristics of the wafer. The temperature was measured by mounting thermo-couples on the wafers. The wafer temperature becomes about 700° C. by cooling the wafer in the cooling zone 20 below the reaction tube for about 10 seconds, and then becomes about 100° C. by cooling the wafer in the cooling boat for about 3 minutes.

According to this embodiment, since each of the pair of wafer has one face facing the plate-shaped cooling member 20, the two wafers can be cooled rapidly at the same cooling speed. Further, since the width of the furnace entrance of the high temperature furnace 2 is small, heat dissipation from inside of the high temperature furnace to the outside can be made small.

The insertion holder 14 changes its temperature along with the in/out motion at the high temperature furnace 2. Since the top end portion 26 and the support pillar 28 of the holder 14 have thin thickness structure, the heat capacity thereof is small, and they have only a small influence on the temperature distribution in the wafer under heating.

When two wafers 16 and the disk 22 are aligned with respective gaps therebetween and inserted into the high temperature furnace 2, the outer faces of the two wafers 16 are almost uniformly heated. For the inner faces, however, heating through the gaps becomes larger as it approaches the outer periphery. Here, the peripheral portion 34 of the disk 22 has an increased thickness and hence an increased heat capacity compared to the central portion 36 of the disk 22, and hence is hard to change its temperature. As a result, the peripheral portion of the wafers 16 has a substantially similar temperature increase as in the central portion of the wafer due to both the actions of heating through the gaps and the heat capacity of the disk. Therefore, the wafer surface attains a uniform temperature. The reason why there is no thick portion in the lower portion of the disk 22 is the top end portion 26 and the support pillar 28 of the insertion holder on the lower portion can perform a similar function as a thick portion.

Figure 18:
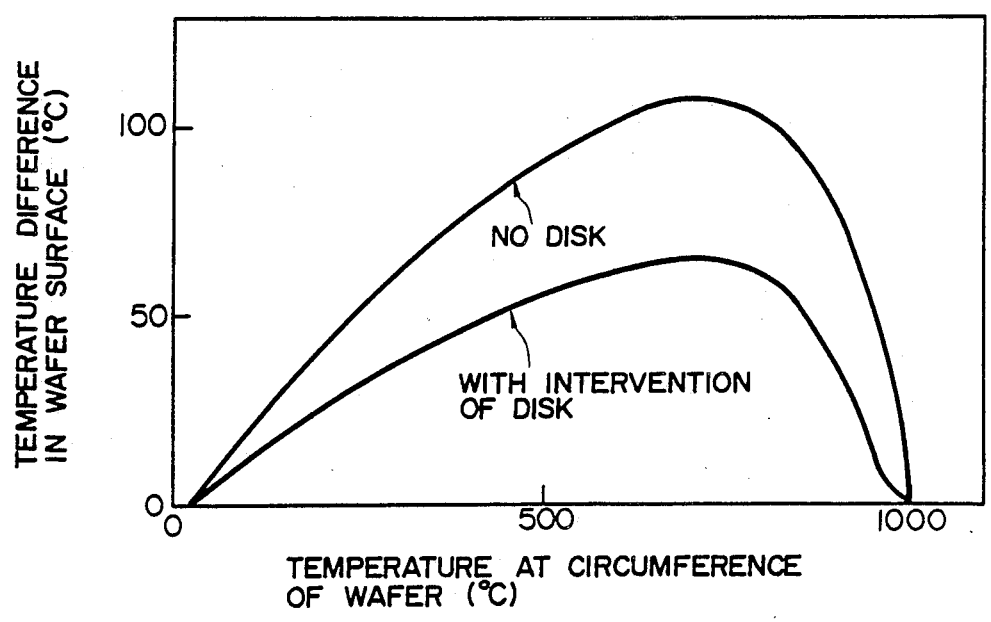
FIG. 18 is a graph showing calculation results on the temperature difference in a wafer surface.

Transient temperature changes when room temperature wafers are loaded on an insertion holder of 500° C. and inserted into a high temperature furnace are calculated by numerical computation. FIG. 18 shows the calculation results of the temperature difference (between the peripheral portion and the central portion) in the wafer surface for both cases when the wafers sandwich a disk of said typical dimensions and when there is no disk between the wafers. The abscissa represents the temperature of the peripheral portion of the wafer in the transient state. Such approximations are adapted in the calculation that the disk is made of opaque quartz, that the high temperature furnace has a uniform temperature field of 1000° C., and that the influence of the support pillar of the wafer insertion holder is neglected. It be seen that the existence of the disk reduces the temperature difference in the wafer surface in the transient state by about a half.

When the thickness ratio between the central portion 36 and the peripheral portion 34 of the disk 22 is further increased, the maximum temperature difference around the wafer temperature of 700° C. decreases, but the temperature difference around 1000° C. increases.

In this embodiment, the bottom portion of the process tube 10 is always kept open. Since the interior gas is of a high temperature and flows downwards, the exterior atmosphere cannot invade into the process tube 10 by convection or diffusion in the steady state.

Figure 19:
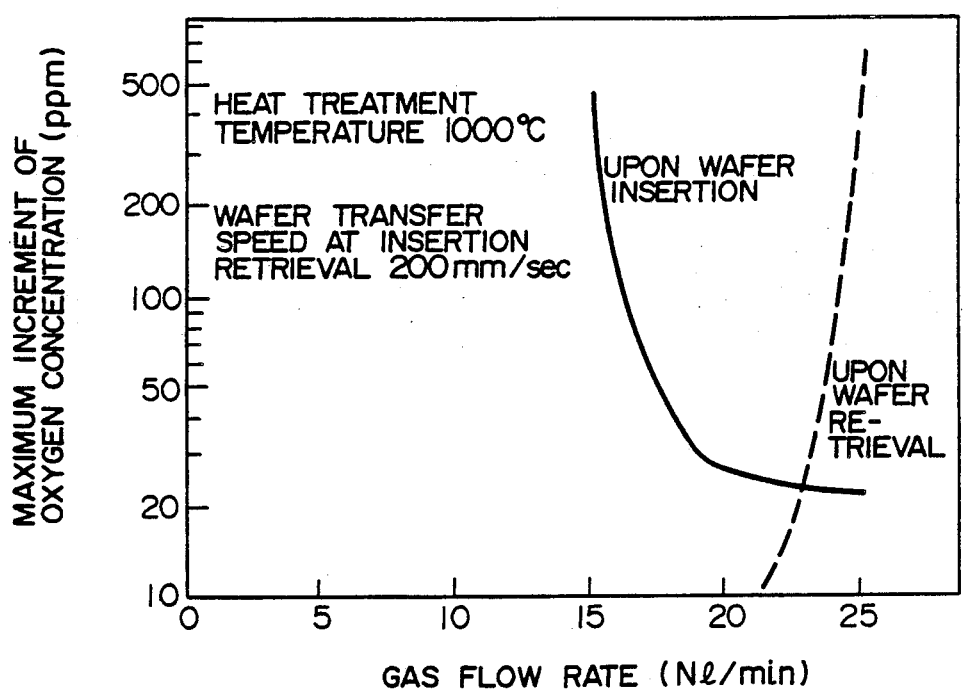
FIG. 19 is a graph of experimental results showing the relation of the gas flow rate and the amount of mixing of the external atmosphere.

FIG. 19 shows the experimental results illustrating the relation of the amount of gas flow and the amount of the exterior atmosphere allowed to enter the process tube 10 upon insertion and take-out of the wafers. High purity nitrogen gas was used as the gas and the oxygen content at the center of the heat treatment chamber was measured. The temperature of the heat treatment chamber was set at 1000° C., and the wafer transfer speed upon insertion and take-out was set at 200 mm/sec. The instantaneous maximum increment of the oxygen content upon insertion is shown by a solid curve and the instantaneous maximum increment upon retrieval is shown by a broken curve.

The amount of mixing of the exterior atmosphere upon insertion can be reduced when the gas flow rate is made 20 Nl/minute or more, while the amount of mixing of the exterior atmosphere upon retrieval can be made small when the gas flow rate is made 20 Nl/minute or less. The reason why the amount of mixing of the external atmosphere becomes smaller as the gas flow rate is made larger upon insertion is that the function of blowing off the in-coming external atmosphere accompanying the wafers becomes larger with the increase of the gas flow rate. The reason why the amount of of the external atmosphere becomes larger as the gas flow rate is made larger upon retrieval is as follows. As the gas flow rate is high, the pre-heating of the gas becomes insufficient. Then, the gas temperature of the gas flowing into the process tube does not reach the temperature of the heat treatment chamber. Thus, there occurs a convection in the heat treatment chamber. When the wafers are taken out in such a state, external atmosphere is sucked in from the furnace entrance of an amount to the volume of the wafers and the insertion holder which have gone out of the heat treatment chamber. Such in-coming atmosphere can go deep into the heat treatment chamber due to the convection in the heat treatment chamber.

From the above, it can be seen that the amount of mixing of the external atmosphere can be made small by increasing the gas flow rate upon insertion and decreasing the gas flow rate during the heat treatment and upon retrieval. In the example of FIG. 19, the amount of mixing of the external atmosphere can be always be made small even when the gas flow rate is kept constant at 20 Nl/minute. When the gas flow rate is further reduced during the heat treatment and upon retrieval, there is obtained the advantage of reducing gas consumption. When the heat treatment chamber is at a lower temperature than in the case of FIG. 19, the amount of mixing of the external atmosphere upon wafer retrieval shifts to a lower value than that for the FIG. 19 case (i.e. the broken line in FIG. 19 shifts leftwards). Then, the amount of mixing of the external atmosphere cannot be made small simply by keeping the gas flow rate constant throughout insertion and retrieval.

Figure 20:
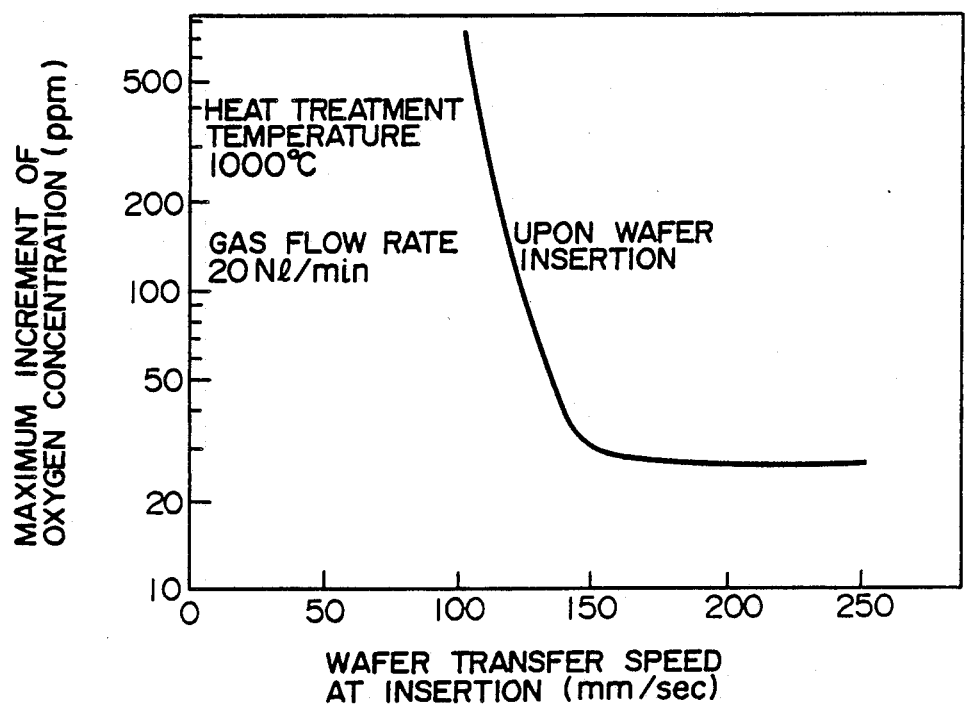
FIG. 20 is a graph of experimental results showing the relation between the speed of wafer insertion and the amount of external atmosphere mixed.

FIG. 20 illustrates the relation between the wafer transfer speed and the amount of mixing of the external atmosphere upon wafer insertion. When the wafer transfer speed is 150 mm/sec or below, the amount of mixing of the external atmosphere upon insertion becomes large.

In the above description, the heater temperature controllers 46a, 46b and 46c were assumed to be of PID control type, but they may also be of other types such as feed-forward control type.

Also, although two control valves 60 and 64 are on-/off controlled to high/low change the flow rate of the treatment gas, one flow rate controller can be used instead.

It may also be adopted that experiments may preliminarily be made for all the conditions to obtain data of set temperatures of the heater temperature controllers with respect to time and those data base may be stored in the main controller and heater set temperatures may be outputted according to the operating conditions without performing operation processes.

It may also be adopted that without preliminarily storing data $w_1$ and $w_2$ in the main controller, the internal temperature $w_1$ of the heat treatment chamber in the steady state and the internal temperature $w_2$ of the heat treatment chamber immediately before the second insertion may be measured for each successive insertion to use them in operation processes of the heater set temperatures upon the third and following insertions.

A second gas supply tube may also be provided separately from the gas supply tube 54, and a large amount of gas may be caused to flow from the second gas supply tube upon the wafer insertion.

When multiple temperature sensors 50 are used inside the heat treatment chamber is pluralized and the temperature control inside the heat treatment chamber is made fine, the uniformity can further be improved.

In the preceding embodiment, maintenance is easy because the disk 22 and the support pillar 28 are detachable. The disk 22 and the pillar 28, however, may be integrated.

Also, since the wafer diameter and the disk diameter are equal, there is obtained an advantage that the dimensions of the high temperature furnace can be made substantially the same as those for the case of loading only the wafers. The disk diameter, however, can be made a little larger than the wafer diameter. In such a case, also, the inner diameter of the thick ring portion 34 of the disk may be selected a little smaller than the wafer diameter.

Although the cooling members 20 are used in the preceding embodiment, the wafers may be cooled by direct radiation to the external space without the cooling members.

Figure 21:
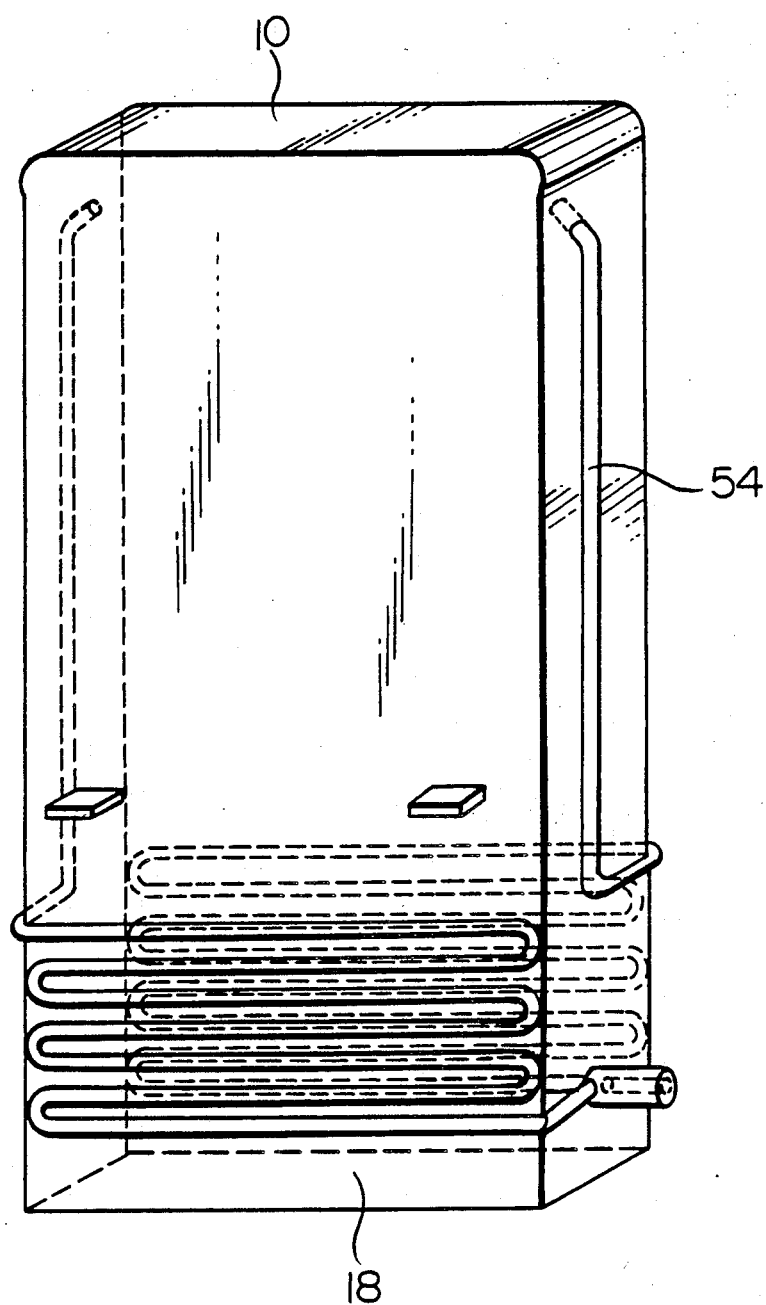
FIG. 21 is a perspective view of a process tube according to another embodiment of the invention.

Further, as shown in FIG. 21, it is economical to wind the piping 54 of the treatment gas around the lower part 18 of the process tube 10, so as to form a cooling zone with the treatment gas and to pre-heat the treatment gas.

Figure 22:
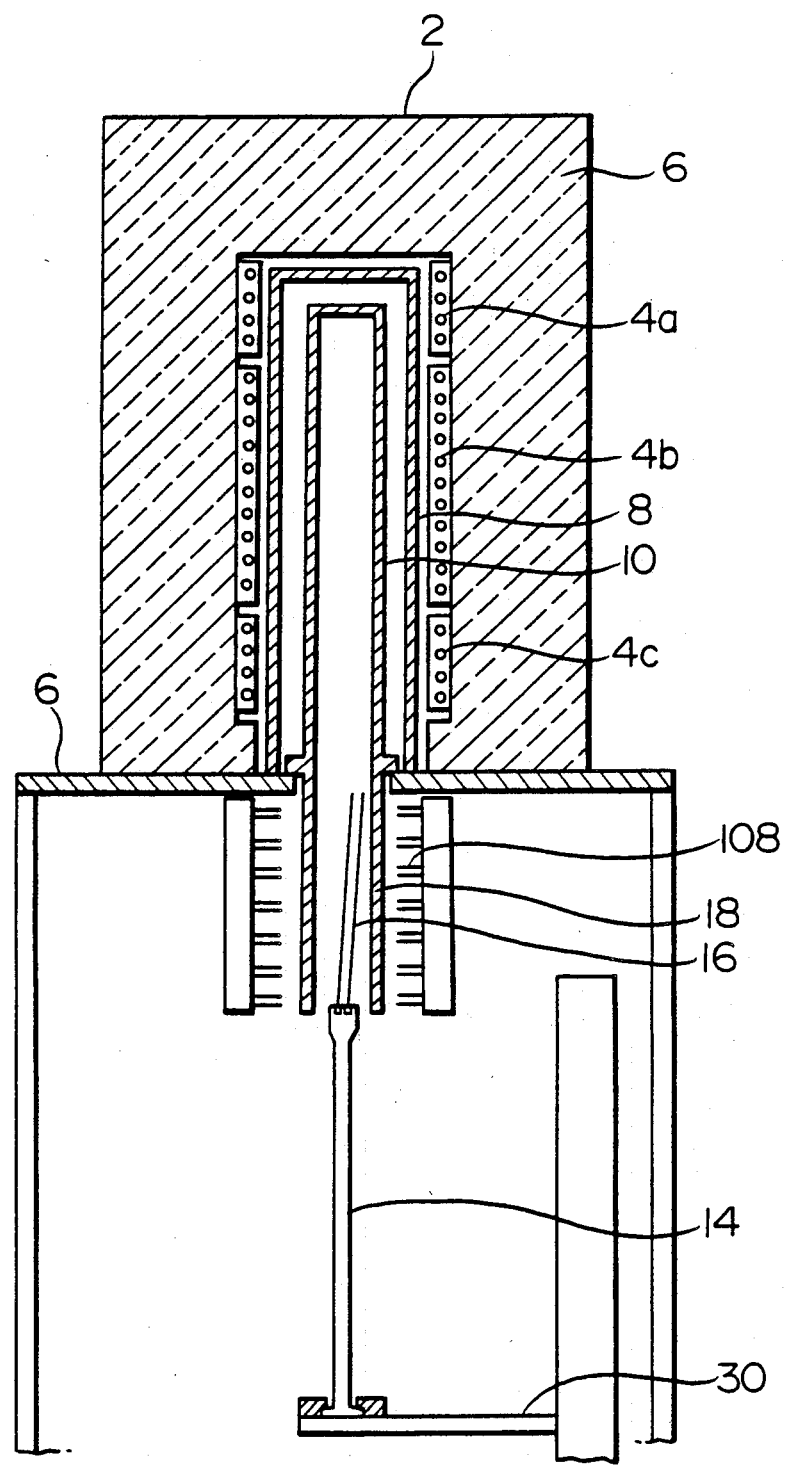
FIG. 22 is a longitudinal cross-section of a high temperature furnace according to another embodiment of this invention.

Further, as shown in FIG. 22, gas flow ports 108 may be provided at a lower part of the high temperature furnace to blow a collant gas onto the lower part 18 of the process tube 10 to cool it.

Further, when the wafers are to be cooled at the lower part 18 of the process tube 10 after the heat treatment, the wafers may be transferred from the insertion holder to a separate cooling holder (not shown) and another set of wafers may be loaded on the insertion holder 14 and inserted into the inside of the high temperature furnace 2, so as to reduce the cycle of the heat treatment and to improve productivity.

Also, without extending the lower part of the process tube, another structure, separate from the reaction tube, may be used to shield the cooling domain from external air, with similar technical effect.

Also, two or more temperature zones may be formed in the high temperature furnace, and the wafers may be pre-heated before the heat treatment. In this case, the temperature zone of the higher temperature is better positioned higher to prevent gas convection.

When the wafers under heat treatment are rotated in the high temperature furnace, it becomes possible to heat the wafers more uniformly. In this case, a wafer or wafers may be attached to a disk and the wafers may be rotated together with the disk.

Also, two semiconductor wafers may be brought into close contact to each other and may be subjected to heat treatment. In this case, there is no need to provide an intervention disk 22 between the wafers, but some mechanism may be provided to bring a pair of wafers in close contact to each other and to separate the contacting wafers.

The high temperature furnace, wafers and all the other mechanisms may be slanted even to a large degree (for example 45 degrees from the vertical direction).

Figure 23:
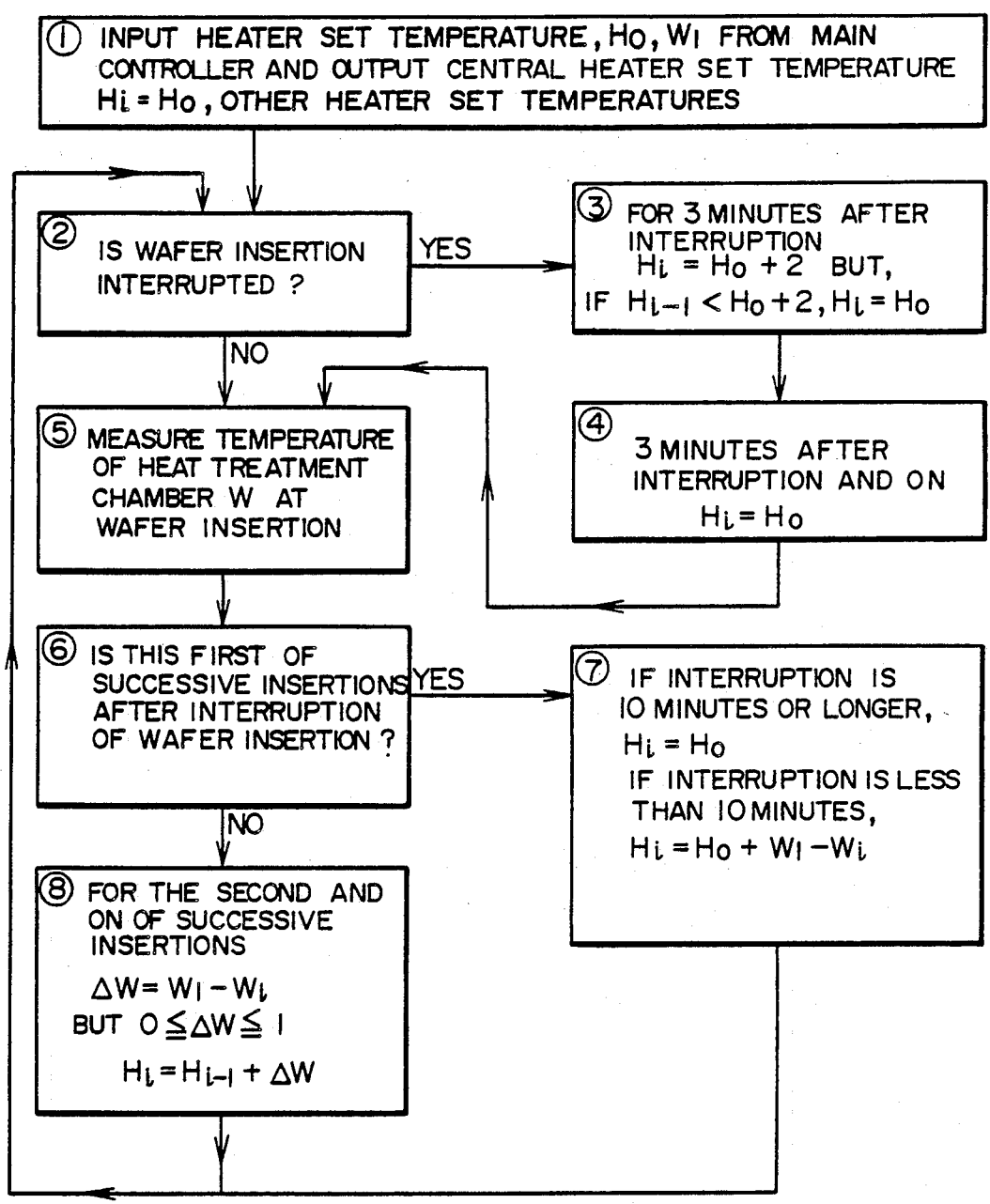
FIG. 23 is a flow chart of an operation process in a heat treatment temperature controller according to another embodiment of this invention.

FIG. 23 shows a flow chart of operation processes to be done in the heat treatment temperature controller 52 according to another embodiment of the invention. In this embodiment, ⑧ from the second insertion and on of the successive insertion, the heater set temperature for the central region is corrected so that the heat treatment chamber internal temperature wi immediately before the wafer insertion approaches the value $w_1$ in the steady state.

Figure 24:
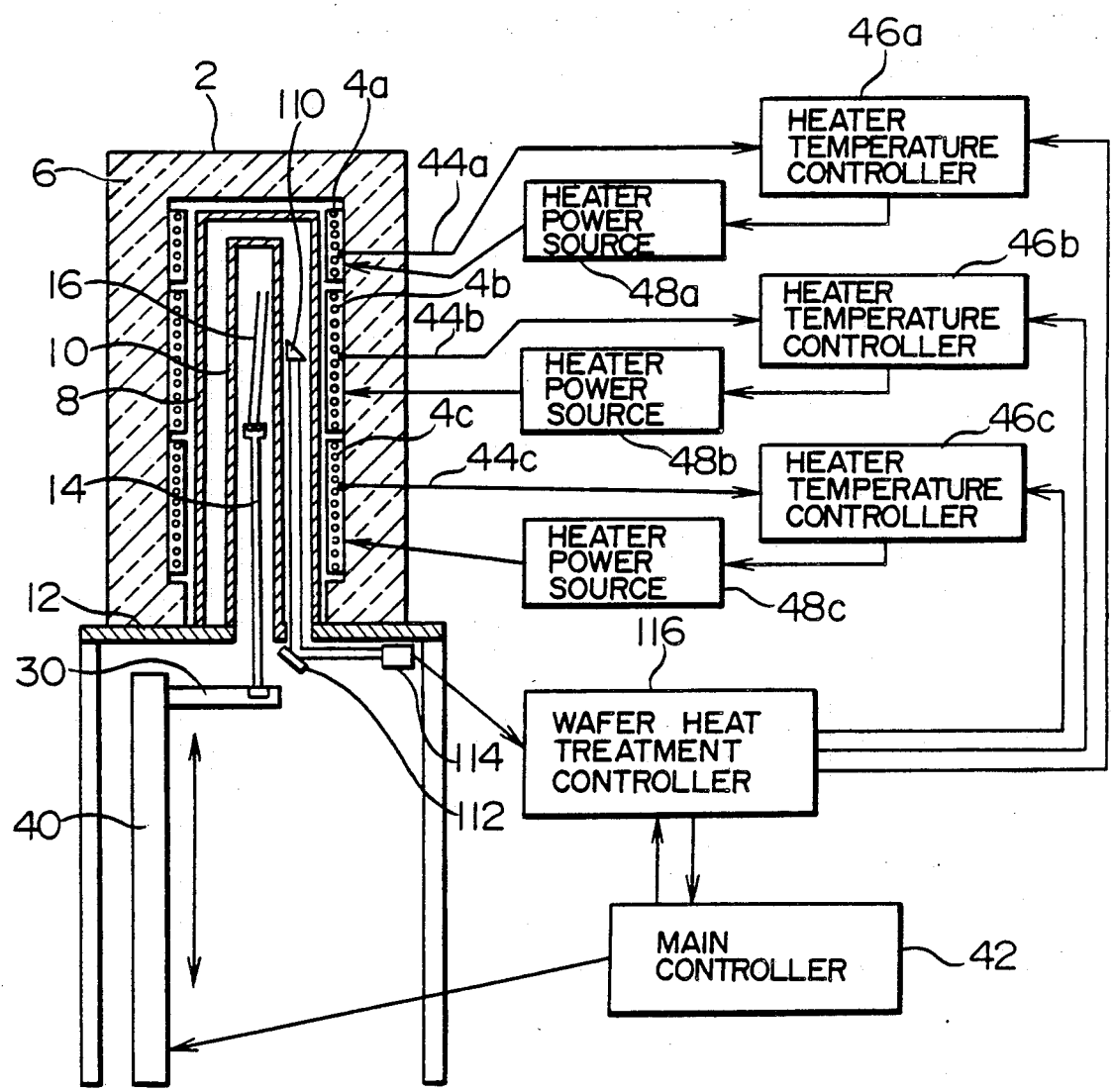
FIG. 24 is a longitudinal cross-section of a high temperature furnace in a diffusion apparatus according to another embodiment of this invention and a block diagram of an associated control system.

FIG. 24 shows a longitudinal cross-section of a high temperature furnace 2 of a diffusion apparatus and block diagram of a control system according to another embodiment of this invention. Between linear tube 8 and process tube 10, a prism 110 (made of quartz glass, etc.) is inserted at the position of wafer insertion, and a mirror 112 is provided just below the prism 110 outside the high temperature furnace, and further a radiation thermometer 114 is provided. The radiation energy emitted from the wafers 16 is guided to the radiation thermometer 114 through the prism 110 and the mirror 112, to enable measurement of the temperature of the wafer under heat treatment. The data of the wafer temperature from the radiation thermometer 114 are sent to a wafer heat treatment controller 116, where the operation process as described later is controlled to supply set temperatures to the respective heater temperature controllers 46a, 46b and 46c.

Figure 25:
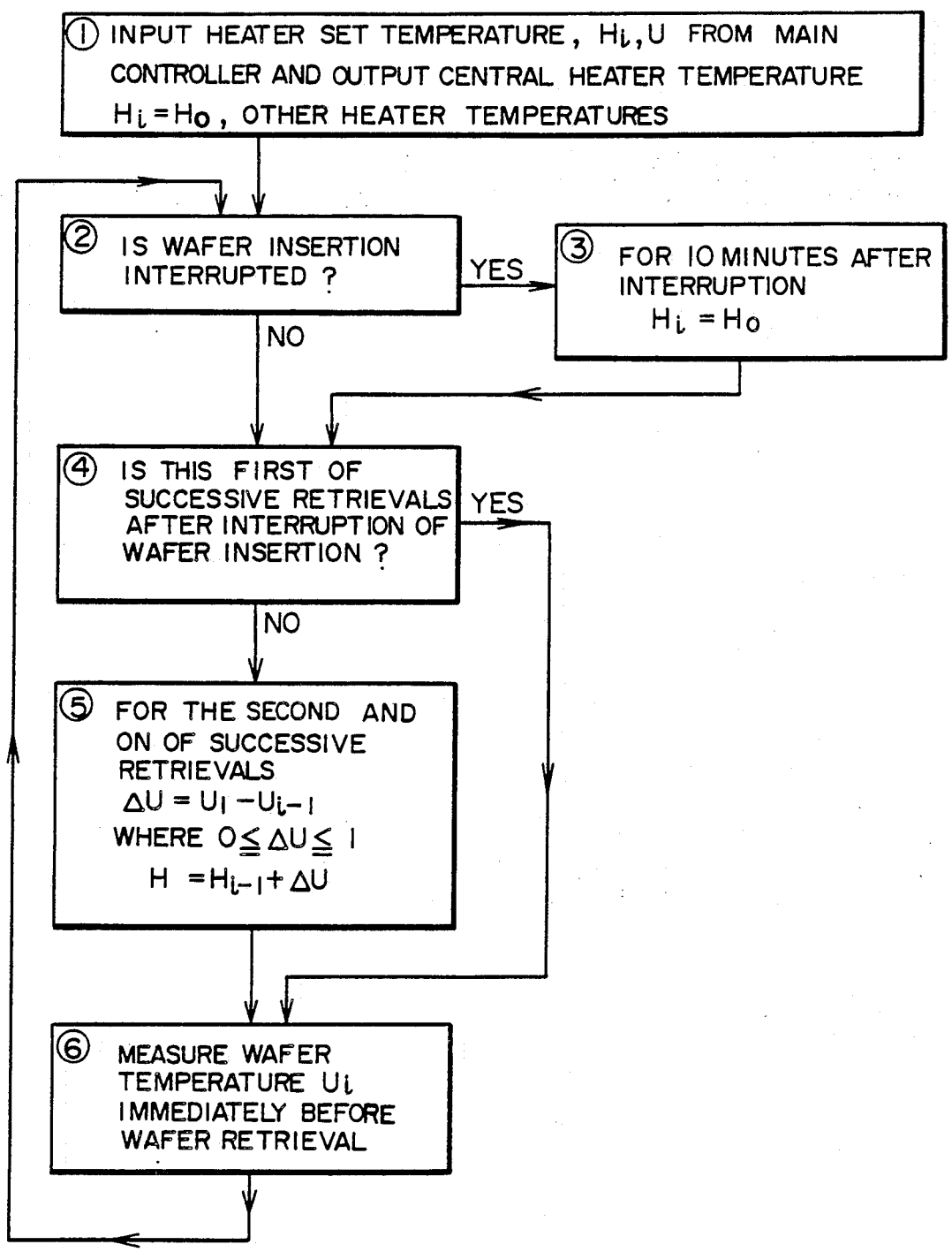
FIGS. 25 and 26 are flow charts of operation processes in a wafer heat treatment controller according to other embodiments of this invention.

FIG. 25 shows a flow chart of the operation process in the wafer heat treatment controller 116. In this figure, ⑤ from the second and on of the successive retrievals, the heater set temperature for the central region is corrected such that the wafer temperature $U_{i-1}$ immediately before the wafer retrieval approaches the value $U_1$ immediately before the first retrieval of the wafer. According to this embodiment, since the wafer temperature is directly measured and the heater temperature is controlled thereby, the wafer heat treatment can be done with high precision and uniformity.

Figure 26:
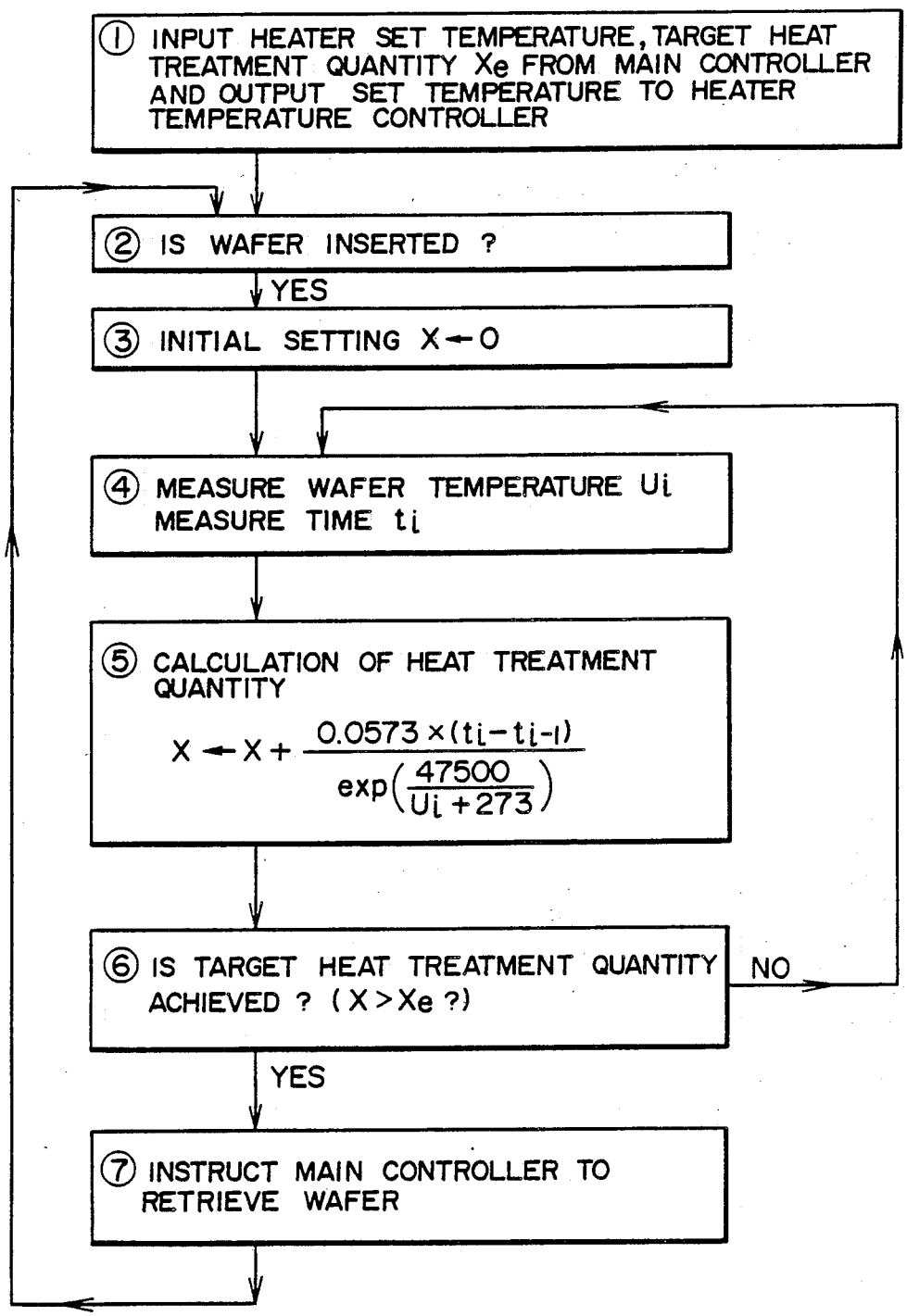

FIG. 26 shows a flow chart of the operation process to be performed in the wafer heat treatment controller 116 according to another embodiment of this invention. In this figure, ② after the wafers are inserted, ④ the wafer temperature $U_i$ is measured continuously by the radiation thermometer 114, ⑤ and the calculation of the amount of heat treatment X is done, ⑥ when the target heat treatment $X_e$ is achieved, ⑦ wafer retrieval is instructed to the main controller. In FIG. 26, the calculation formula for the heat treatment quantity X is exemplified by the formula of diffusion distance of arsenic atoms in a silicon wafer. It is desirable to change the calculation formula depending on the conditions of heat treatment. In this embodiment, the heater set temperatures for all the heaters are not changed at every insertion. According to this embodiment, the heat treatment of wafers can be made uniform even when the temperature of the heat treatment chamber is varied.

FIGS. 27 to 31 show longitudinal cross-sections of the wafer-loading portion of the wafer insertion holder according to other embodiments of this invention. FIG. 27 shows a case where a thick portion 34 is provided also at the lower portion of the disk 22. FIG. 28 shows a case where a ring plate 118 between a pair of wafers 16. For reducing the temperature distribution in the wafer surface upon insertion, the thickness of the ring plate 118 may better be selected at a similar value as the thickness of the wafer 16.

FIG. 29 shows a case where the disk member is changed into a laminate structure of three layers wherein a pair of disks 22 are attached on the both sides of a ring plate 118a.

FIG. 30 shows a case where the disk member is changed into a laminate structure of two layers wherein a ring plate 118b and a disk 22 are superposed.

FIG. 31 shows a case where the thickness of the disk 22 is continuously varied in the radial direction.

Figure 32:
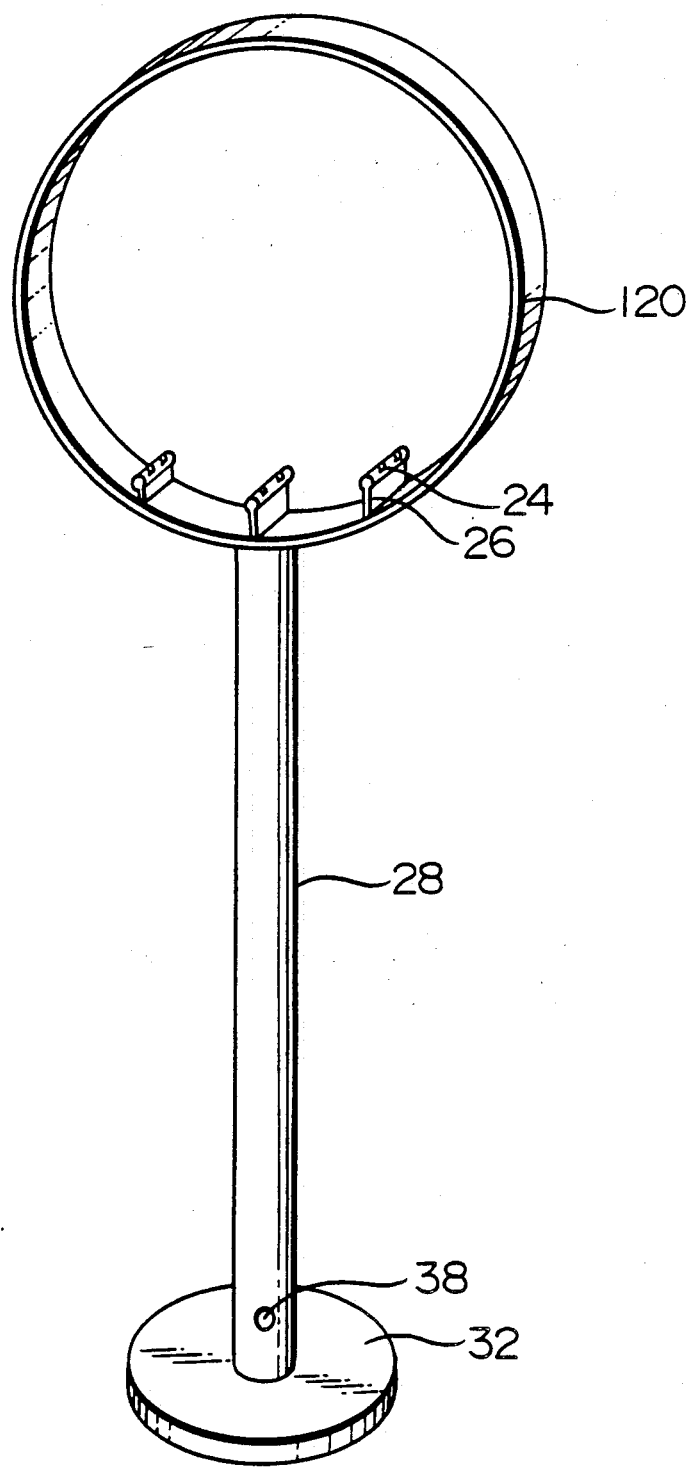
FIG. 32 is a perspective view of a wafer-inserting holder according to another embodiment of this invention.

An exterior view of a wafer insertion holder according to another embodiment of this invention is shown in FIG. 32. The holder has a ring 120 which is located around the periphery of the wafer with a little larger diameter than the wafer diameter, and a top end portion 26 disposed inside the ring 120 and formed of round rods with grooves 24 and thin plates. The distance between the inner wall of the ring 120 and the outer edge of the wafers is preferably selected at 10 mm or below, and the width of the ring 120 is preferably about three times as wide as the gap between the wafers. According to this embodiment, when the insertion holder carrying two wafers is being inserted into the inside of the high temperature furnace 2, heat otherwise radiating through the gap between the two wafers to the inside of the two wafers is shielded by the ring 120, and both the wafers are heated uniformly only by the heating upon the outer surfaces.

The effect can be made greater if the surface of the ring 120 is roughened by sand blasting, etc. or is made opaque by coating, etc.

FIGS. 33 to 35 show longitudinal cross-sections of wafer-loading portions of the wafer insertion holder according to other embodiments of this invention. FIG. 33 shows a case where the ring 120a has an arcuate cross-section to be disposed around the wafers 16.

FIG. 34 shows a case where the ring 120b has a V-shaped cross-section to be disposed around the wafers 16. In this embodiment, the ring 120b diverges towards the outside in the radial direction, enhancing loading and unloading of the wafers.

FIG. 35 shows the case where the ring 120a has an angled U-shape cross-section to be disposed around the wafers.

FIG. 36 shows an exterior view of a wafer insertion holder according to another embodiment of this invention, and FIG. 37 shows a longitudinal cross-section of the holder of FIG. 36. Inside the outer periphery of the two wafers 16, a ring 120d provided. The cross-section of the ring 20 is circular with a diameter a little smaller than the gap between the wafers. There is provided no ring at the lower part of the wafers so that the wafers can be carried by the load holder and the unload holder as shown in FIG. 12.

FIG. 38 shows a case where the cross-section of the ring 120e has a rectangular shape. The inner diameter of the ring 120 is selected approximately equal to the wafer diameter.

As shown in FIGS. 39 and 40 the combination of a disk 22f and a ring 120f (FIG. 39) and a hollow disk and a ring 120g (FIG. 40) may also be employed to finely adjust heat transfer to the wafers 16.

Figure 41:
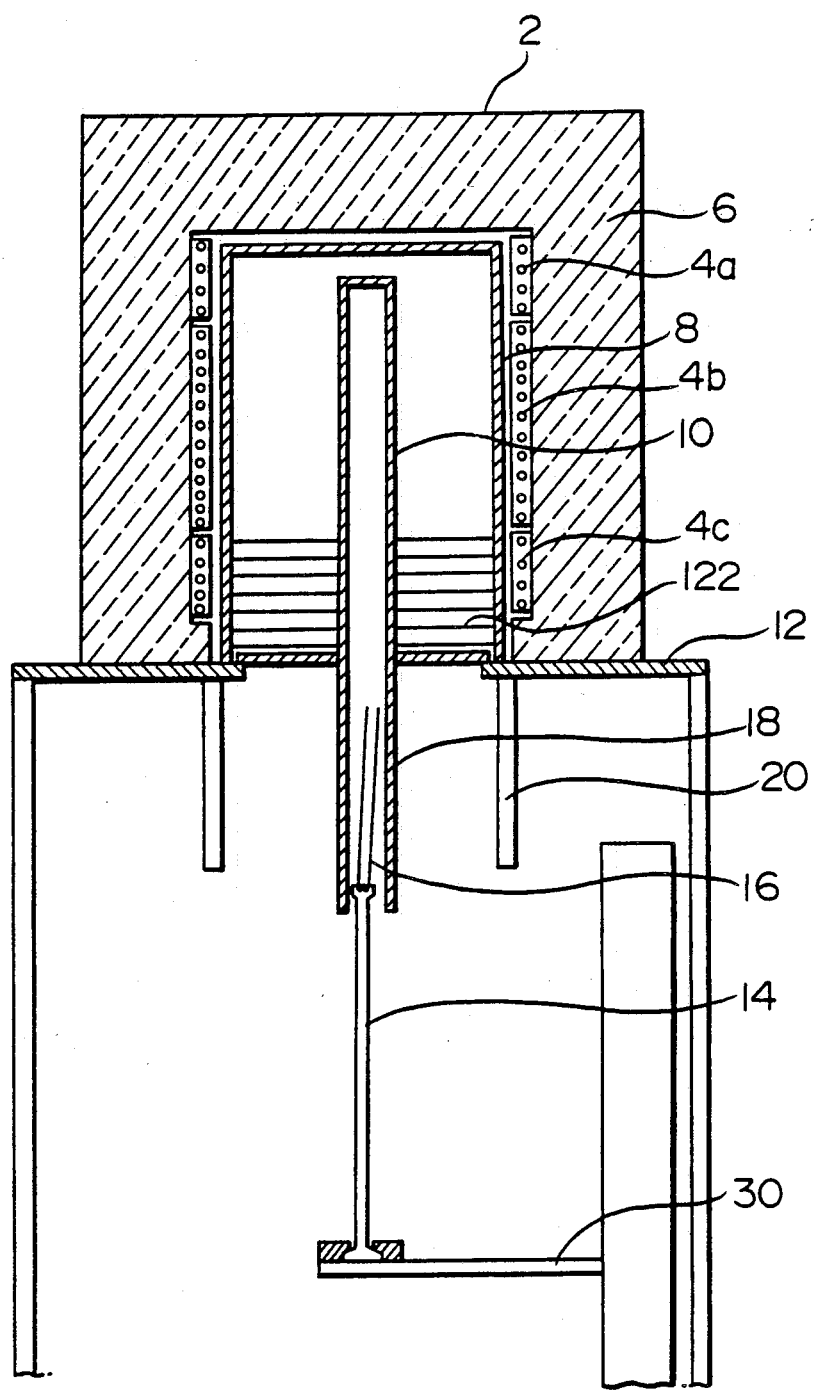
FIGS. 41 to 44 are longitudinal cross-sections of high temperature furnaces according to other embodiments of this invention.

FIG. 41 shows a longitudinal cross-section of a high temperature furnace according to another embodiment of this invention. Inside a high temperature furnace 2 of a vertical cylinder shape, a linear tube 8 of a cylinder shape and a process tube 10 of a rectangular pipe shape are provided. The lower part 18 of the process tube 10 extends below the high temperature furnace 2 and is surrounded by a cooling member 20. In a lower portion of the high temperature furnace 2 between the process tube 10 and the linear tube 8, there are provided radiation shield plates 122. This embodiment employs a cylinder-shaped high temperature furnace 2 and hence is easy to manufacture and has a high strength. Due to the provision of the radiation shield plates 122, heat dissipation from the high temperature space inside the high temperature furnace 2 to the cooling member 20 and to the exterior can be made small.

Figure 42:
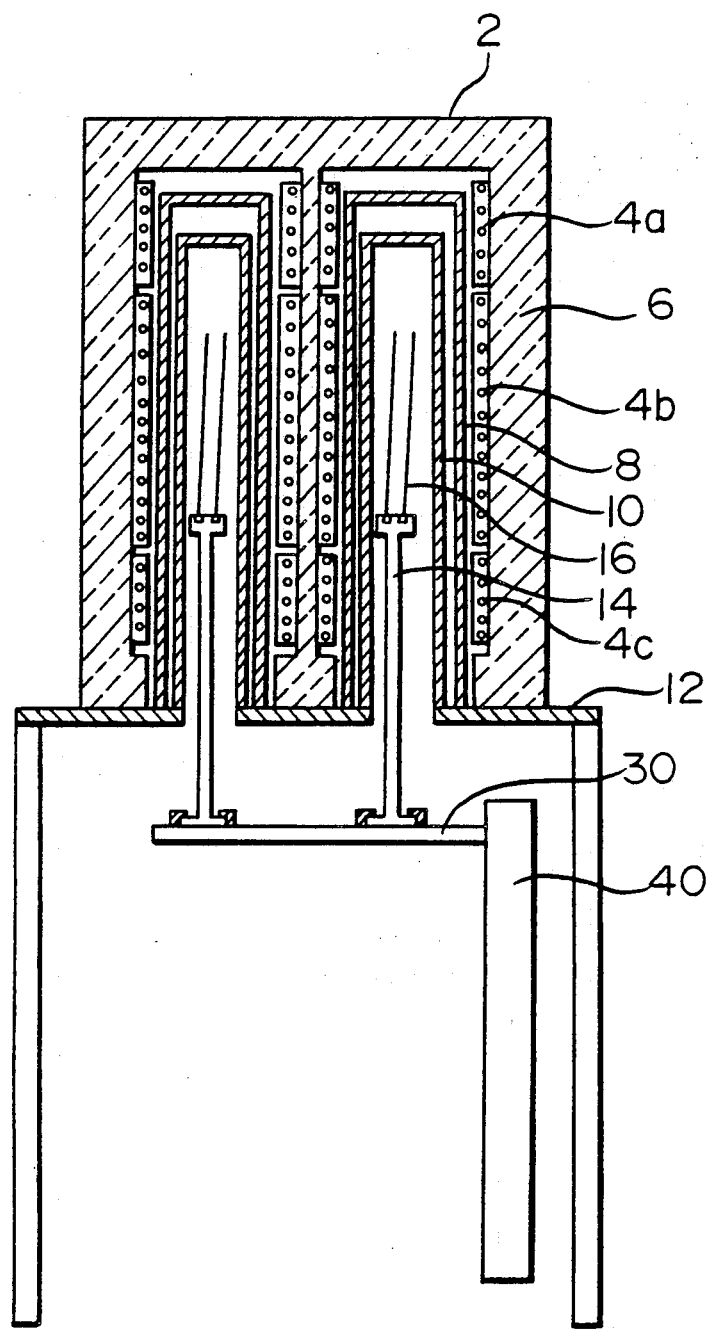

FIG. 42 shows a longitudinal cross-section of a high temperature furnace of a diffusion apparatus according to another embodiment of this invention. Inside a single high temperature furnace 2, two heating spaces are formed and heated by parallel plate shaped heaters 4a, 4b and 4c. In each heating space, a pair of wafers are inserted. A common up/down carrier 30 carries all the wafers. According to this embodiment, four wafers can simultaneously be heat-treated.

Figure 43:
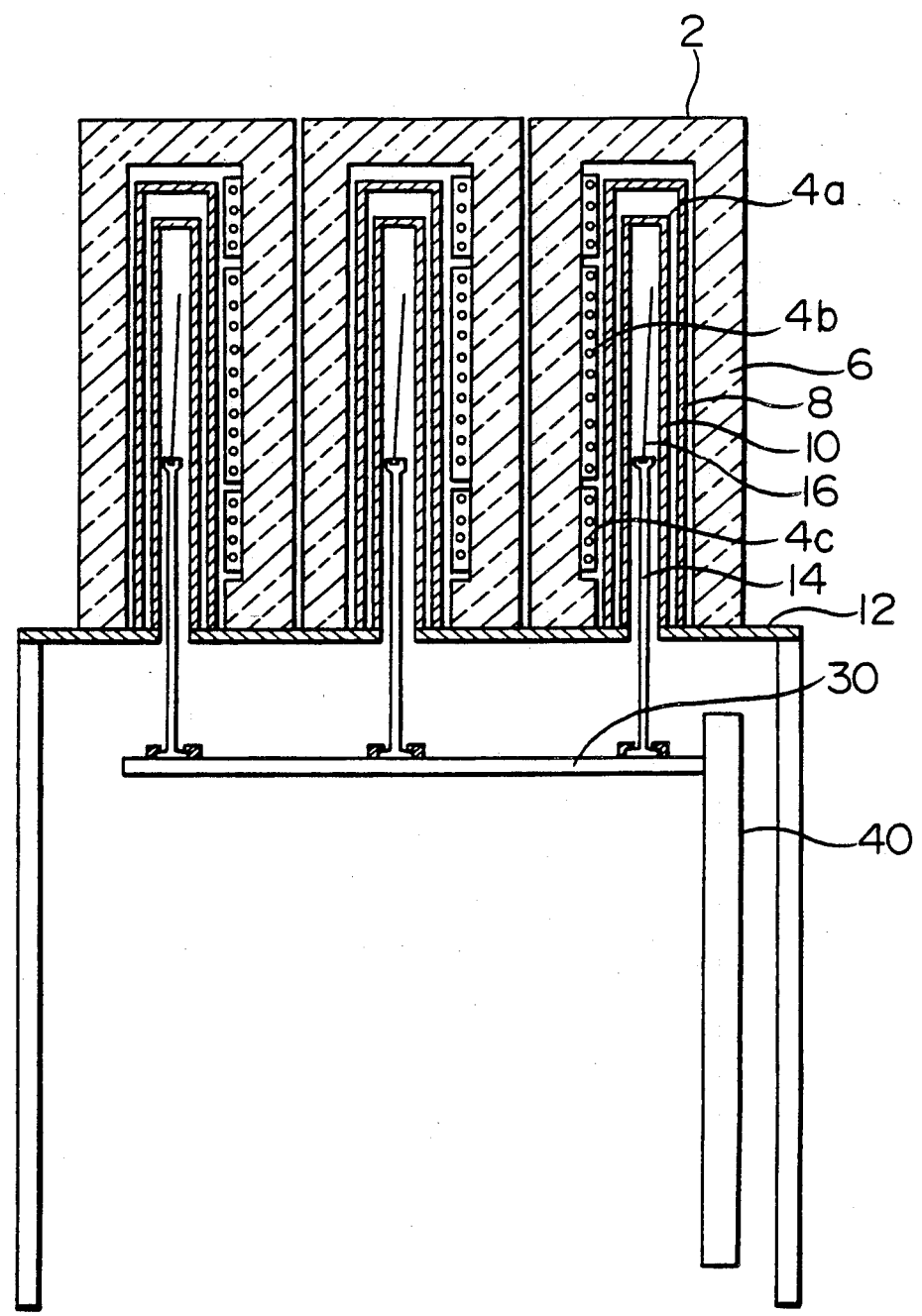

FIG. 43 shows a longitudinal cross-section of a high temperature furnace according to another embodiment of this invention. Three high temperature furnaces 2 are connected together, in each of which furnaces a single wafer 16 is heated by a single plate-shaped heater 4a, 4b, or 4c. A common up/down carrier 30 carries and moves all the wafers. According to this embodiment, three wafers can simultaneously be heat-treated. Two or more high temperature furnaces may be connected together.

Figure 44:
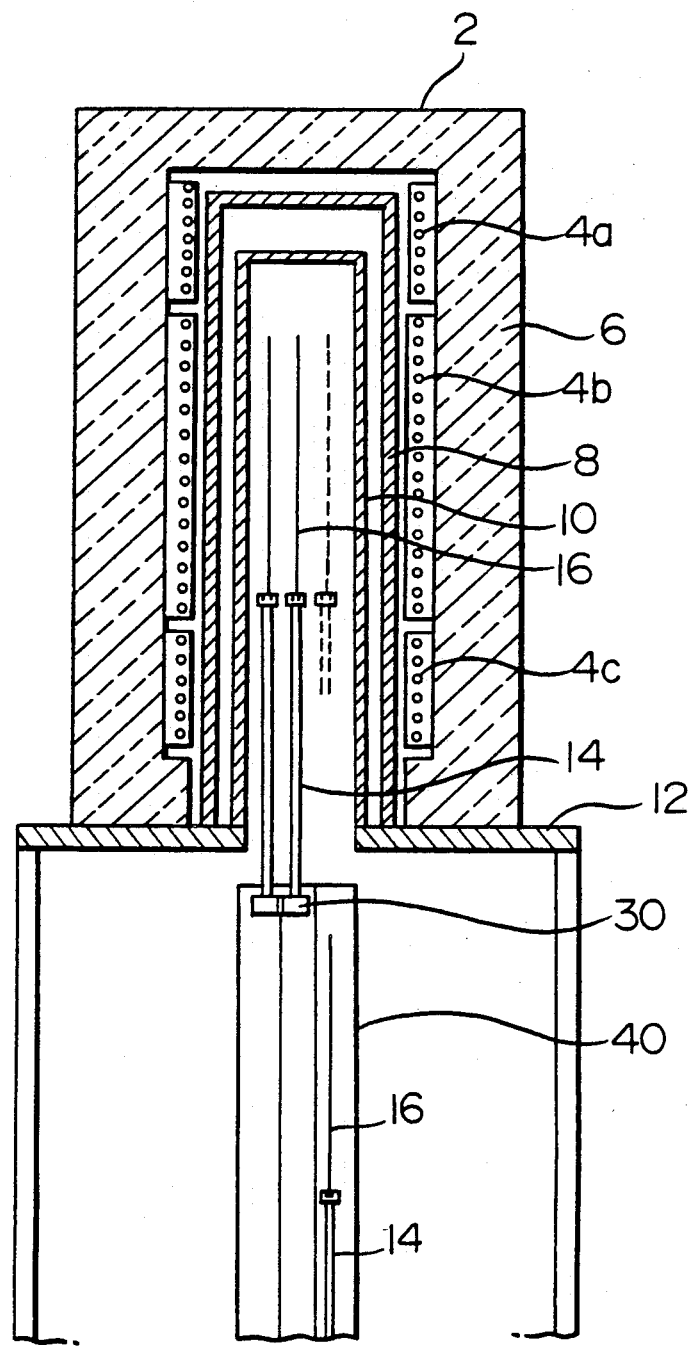

FIG. 44 shows a longitudinal cross-section of a high temperature furnace according to another embodiment of this invention. A high temperature furnace 2 is formed by parallel plate shaped heaters 4a, 4b and 4c. Each of three wafers 16 is carried on an independent insertion holder 14 and moved by an independent up/down carrier 30. Inside the high temperature furnace 2, always two wafers 16 are inserted. The third insertion holder is taken away from the heater and is subjected to wafer alternation or exchange. As one wafer which has completed the heat treatment is taken out of the heater, the new wafer is inserted into the heater. According to this embodiment, the high temperature furnace 2 can be effectively utilized to improve the throughput.

The functions and the technical advantages of the above-described embodiments may be summarized as follows.

First, the functions may be analyzed as follows.

(1) In a high temperature furnace, at least one face of each wafer faces against an inner wall of the high temperature furnace, and the heater of the high temperature furnace is divided into a plurality of domains in the direction of the wafer face and is subjected to respective heat generation control. Therefore, the whole face of the wafer can be uniformly heat-treated, including in the transient state. Further, since two wafers can be heated under equivalent conditions, the heating of the two wafers becomes equivalent. Since the insertion and retrieval of the wafer is done at a high speed, there almost no difference in the heating time between portion which is inserted first and the portion which is inserted last.

(2) By cooling the high temperature wafer after the heat treatment in a cooling zone at a lower part of the reaction, tube, the wafer can be cooled without removing the wafer from the process tube, preventing direct exposure of the high temperature wafer to the exterior atmosphere. Also, each of the two wafers in the cooling zone has one face facing against the cooling member or the exterior. Thus, the cooling speeds for the two wafers are almost the same and are rapid.

(3) When two wafers are positioned with a specified gap therebetween, it is easy to load and unload the wafers on and from the insertion holder. Wafers are supported in a small groove or grooves. Thus, the contact area between the wafer and the holder is small, and hence the wafer portion which is subjected to non-uniform heat-treatment due to contact with the holder can be made, small. As the two wafers are separated by the specified gap, the peripheral portions of the inside of the wafers are heated from the gap. By inserting between the wafers a disk which has a greater thickness in its peripheral portion, the speed of temperature rise can be equalized between the peripheral portion and the central portion of the wafer.

(4) When the temperature of the heat generating portion of the heater is controlled to keep the internal temperature of the heat treatment chamber constant for each wafer insertion, the heat treatment of the wafer for the respective wafer insertions can be kept uniform.

When the wafer supply is interrupted, the interior temperature of the heat treatment chamber can be returned to the steady state value by returning the temperature of the heat generating portion of the heater to a predetermined value.

(5) When the gas supply quantity at the wafer insertion is made large, the exterior which would otherwise go along with the wafer, can be blown off, and hence the amount of mixing of the exterior atmosphere can be made small. When the gas supply quantity at the retrieval of the wafer is made low, convection inside the heat treatment chamber can be suppressed to reduce the mixing of the exterior atmosphere.

Second, the technical advantages may be described as follows.

(1) When two wafers are simultaneously heat-treated using a high temperature furnace, two wafers can be equally heated, and the heat generation of the heater in the directions of the wafer faces can be controlled. Thus, it becomes possible to keep the wafer face at a uniform temperature, including during the transient state, and to achieve uniform heat treatment in a short time period.

(2) The high temperature wafers which have completed heat treatment can be cooled uniformly without directly exposing them to the exterior atmosphere. There need be no fear of wafer contamination, and the yield of the heat treatment can be improved.

(3) It becomes easy to load and unload two wafers. By inserting a disk, which has a varying thickness in the radial direction, between the wafers, the temperature distribution in the wafer face in the transient state can be reduced. Thus, it becomes possible to achieve uniform heat treatment in a short time period without causing thermal stress defects. In the case as shown in FIG. 18, the temperature difference in the wafer face at insertion can be reduced to about a half and the yield of the heat treatment can be improved.

(4) The heat treatment quantity for the wafers over a number of wafer insertions can be kept uniform. For example, in the case as shown in FIG. 15, the effective heat treatment temperature is lowered over 4° C. by ten wafer insertions without control of the set temperature, whereas it can be kept within a temperature range of 2° C. with control of the set temperature.

(6) The amount of of the exterior atmosphere can be always made small, including during the times of insertion and retrieval. Thus, it is possible to prevent bringing of dust containing oxygen into the process tube and the yield of the heat treatment can be improved.

According to the invention, it is possible to uniformly heat semiconductor wafers in a short period, and to uniformly cool them rapidly without exposing them to the external atmosphere. There is provided a semiconductor heat treatment apparatus of high quality and high efficiency.

We claim:

1. An apparatus for heat treating semiconductor wafers, comprising:
    a high temperature furnace having a vertically extending, elongated interior chamber with a longitudinal axis, closed substantially planar sides, a closed upper end, and a lower end with an aperture adjacent thereto;
    heating means within said chamber and having substantially flat heating surfaces extending in the longitudinal direction along two opposite ones of said substantially planar sides of said chamber substantially parallel with each other to define a heating zone within said chamber, with said chamber aperture adjacent the lower end of said heating zone to permit semiconductor wafers to be inserted within and retrieved from said heating zone;
    support means for supporting semiconductor wafers in a heating position within said heating zone with each wafer having a side surface facing said heating surfaces to receive heat therefrom; and
    means for moving said support means to position semiconductor wafers supported on said support means between said heating position and a second position outside said heating zone.

2. An apparatus according to claim 7, wherein said support means includes a ring member having a diameter greater than the diameter of semiconductor wafers to be supported on said support means and adapted to be disposed adjacent the peripheral portion of semiconductor wafers supported on said support means while spaced from such wafers.

3. An apparatus according to claim 2, wherein said ring member has a looped strip shape, the looped strip having a width larger than the gap between two semiconductor supported on said support means, and the looped strip being disposed at a position to shield said gap.

4. An apparatus as claimed in claim 1, wherein said support means is adapted to support two semiconductor wafers.

5. An apparatus as claimed in claim 4, wherein said support means is adapted to support the two semiconductor wafers substantially vertically and in parallel.

6. An apparatus as claimed in claim 5, wherein said support means includes an intervening plate adapted to be positioned between and spaced from the two semiconductor wafers.

7. An apparatus according to claim 6, wherein said intervening plate has a disk shape with a thicker portion extending along the periphery thereof and adapted to extend adjacent the periphery of semiconductor wafers supported on said support means.

8. An apparatus as claimed in claim 4 wherein said support means is adapted to support the two semiconductor wafers in parallel and slanted at an angle in the order of 5° from vertical.

9. An apparatus as claimed in claim 1, wherein said heating means comprises a plurality of flat, plate-shaped heaters, arranged within said chamber substantially parallel with each, each heater divided into sections to define plurality of heat generating portions.

10. An apparatus as claimed in claim 9, further comprising means for controlling the temperature of each heat generating portion independently.

11. An apparatus as claimed in claim 9, wherein each heater is divided into five sections.

12. An apparatus as claimed in claim 1, further comprising a process tube extending longitudinally within said heating zone for receipt of the semiconductor wafers therewithin; means for supplying process gas to the upper portion of said process tube to cause the gas to flow downward in said process tube around the semiconductor wafers.

13. An apparatus as claimed in claim 12, further comprising means for controlling the flow rate of the process gas.

14. An apparatus as claimed in claim 12, wherein said process tube includes means for preheating the process gas within the process tube.

15. An apparatus as claimed in claim 1, further comprising a process tube having a first portion disposed within said heating zone for receipt of semiconductor wafers during heat treating thereof and a second portion extending through said chamber aperture to define a cooling zone for cooling semiconductor wafers without direct contact of the wafers with the exterior atmosphere.

16. An apparatus as claimed in claim 1, wherein said support means includes a vertically extending support pillar portion, and an upper portion mounted on the upper end of said support pillar portion for supporting the semiconductor wafers.

17. An apparatus as claimed in claim 16, wherein said support pillar portion comprise an elongated, hollow, thinwalled member with a closed upper end and an opening adjacent the lower end.

18. An apparatus for controlling heat treatment of semiconductor wafers in a high temperature furnace, comprising:
 heating means adapted to be disposed within the high temperature furnace to define a heating zone therein;
 transfer means adapted to successively supply and retrieve semiconductor wafers into and from said heating zone;
 measuring means for measuring the temperature within said heating zone immediately before each wafer is supplied thereto by said transfer means;
 heat controlling means for controlling the temperature of said heating means to a set value; and
 correction means for correcting the set value based on the measured temperature to maintain the temperature within said heating zone immediately before each wafer is supplied thereto substantially constant.

19. An apparatus for controlling heat treatment of semiconductor wafers in a high temperature furnace, comprising:
 heating means adapted to be disposed within the high temperature furnace to define a heating zone therein;
 transfer means adapted to successively supply and retrieve semiconductor wafers into and from said heating zone;
 measuring means for measuring the temperature of a surface of a semiconductor wafer within said heating zone immediately before the wafer is retrieved therefrom by said transfer means;
 heat controlling means for controlling the temperature of said heating means to a set value; and
 correction means for correcting the set value based on the measured temperature to cause the temperatures of the surfaces of second and subsequent semiconductor wafers within said heating zone to substantially reach a preset value before retrieval thereof from said heating zone.

20. An apparatus according to claim 18 or 19, wherein said heating means comprises at least one flat heater plate having an upper portion, a lower portion, a right portion, a left portion, and a central portion encircled by said upper, lower, right and left portions; and wherein said correction means corrects the temperature of said central portion.

21. An apparatus for controlling heat treatment of semiconductor wafers in a high temperature furnace having a longitudinal axis, said apparatus comprising:
 heating means adapted to be disposed within the high temperature furnace and having heating surfaces extending in the longitudinal direction of the high temperature furnace to define a heating zone therein for receiving semiconductor wafers;
 heat controlling means for controlling the temperature of said heating means to a set value; and
 correction means for monitoring the temperature of said heating zone and correcting the set value based on the monitored temperature.

22. An apparatus according to claim 21, wherein:
separated heat generating portions;
 said heat controlling means includes plurality of temperature sensors for detecting the temperatures of respective ones of said heat generating portions, a plurality of thyristor controllers for independently adjusting the temperatures of respective ones of said heat generating portions to respective set values based on the detected temperatures, and a plurality of heater power sources for supplying power to respective ones of said heat generating portions; and
 said correction means includes a heating zone temperature sensor for detecting the temperature within the heating zone, and an operation controller for correcting the set values based on the detected temperature.

23. An apparatus according to claim 21, further comprising a contactless type radiation thermometer adapted to be disposed outside the high temperature furnace, and optical means for guiding radiation emitted from a semiconductor wafer in said heating zone in a direction substantially perpendicular to the surface of the semiconductor wafer to said radiation thermometer.

24. An apparatus according to claim 21 wherein said heat controlling means includes means for measuring the temperature of said heating means and means for correcting the set value based on the measured temperature.

25. An apparatus for controlling heat treatment of semiconductor wafers in a high temperature furnace including transfer means for successively supplying and retrieving semiconductor wafers into and from the high temperature furnace, said apparatus comprising:
 heating means adapted to be disposed within the high temperature furnace to define a heating zone therein within which the semiconductor wafers are inserted;
 measuring means for measuring the temperature of a surface of a semiconductor wafer within said heating zone;
 calculation means for calculating an integrated heat treatment effect based on the time the semiconductor wafer is within the heating zone and based on the measured temperature; and
 transfer control means for causing the transfer means to retrieve the semiconductor wafer from the heating zone when the calculated heat treatment effect reaches a predetermined value.

26. An apparatus for treating semiconductor wafers, comprising:
 a high temperature furnace having a process gas inlet adjacent the top thereof for introduction of process gas to flow downward through the furnace;
 heating means wtihin said high temperature furnace and defining a heating zone therein;
 transfer means for successively supplying and retrieving semiconductor wafers into and from said heating zone, said transfer means moving the semiconductor wafers at a transfer speed of 150 mm/sec during insertion;
 gas flow control means for controlling the supply of process gas to said gas inlet to cause the process gas to flow at a high rate during insertion of semiconductor wafers into said heating zone and to flow at a reduced rate at other times.

27. An apparatus for heat treating semiconductor wafers, comprising:
 a high temperature furnace having a vertically extending, elongated interior chamber with a longitudinal axis, closed sides, a closed upper end, and a lower end with an aperture adjacent thereto;
 heating means within said chamber and having heating surfaces extending in the longitudinal direction of said chamber to define a heating zone therein, with said chamber aperture adjacent the lower end of said heating zone to permit semiconductor wafers to be inserted within and retrieved from said heating zone, said heating means including a plurality of separate heat generating portions;

support means for supporting two semiconductor wafers with each wafer having a surface extending substantially parallel to said heating surfaces and positioned so that each semiconductor wafer within the heating zone is heated by said plurality of heat generating portions, said support means including a ring member having a diameter greater than the diameter of semiconductor wafers to be supported on said support means and adapted to be disposed adjacent the peripheral portion of semiconductor wafers supported on said support means while spaced from such wafers; and means for moving said support means to position semiconductor wafers supported on said support means between a first position outside said heating zone and a second position within said heating zone.

28. An apparatus according to claim 27, wherein said ring member has a looped strip shape, the looped strip having a width larger than the gap between two semiconductor wafers supported on said support means, and the looped strip being disposed at a position to shield said gap.

29. An apparatus for controlling heat treatment of semiconductor wafers in a high temperature furnace having a longitudinal axis, said apparatus comprising:

heating means adapted to be disposed within the high temperature furnace and including a plurailty of separated heat generating portions with heating surfaces extending in the longitudinal direction of the high temperature furnace to define a heating zone therein for receiving semiconductor wafers;

heat controlling means for controlling the temperature of said heating means to a set value, said heat controlling means including a plurality of temperature sensors for detecting the temperatures of respectigve ones of said heat generating portions, a plurality of thyristor controllers for independently adjusting the temperatures of respective ones of said heat generating portions to respective set values based on the detected temperatures, and a plurality of heater power sources for supplying power to respective ones of said heat generating portions; and correction means, including a heating zone temperature sensor for detecting the temperature of said heating zone, and an operation controller for correcting the set values based on the detected temperature.

30. An apparatus for heat treating semiconductor wafers, comprising:

a high temperature furnace having a vertically extending, elongated interior chamber with a longitudinal axis, closed sides, a closed upper end, and a lower end with an aperture adjacent thereto;

heating means within said chamber and having a plurality of flat, plate-shaped heating surfaces extending substantially parallel with each other and in the longitudinal direction within said chamber to define a heating zone therein, with each heater divided into sections to define a plurality of heat generating portions and with said chamber aperture adjacent the lower end of said heating zone to permit semiconductor wafers to be inserted within and retrieved from said heating zone;

support means for supporting semiconductor wafers with each wafer having a surface extending substantially parallel to said heating surfaces and positioned so that each semiconductor wafer within the heating zone is heated by said plurality of heat generating portions; and means for moving said support means between a first position outside said heating zone and a second position within said heating zone.

31. An apparatus as claimed in claim 30, wherein said support means is adapted to support two semiconductor wafers.

32. An apparatus as claimed in claim 30, further comprising means for controlling the temperature of each heat generating portion independently.

33. An apparatus as claimed in claim 30, wherein each heater is divided into five sections.

34. An apparatus for heat treating semiconductor wafers, comprising:

a high temperature furnace having a vertically extending, elongated interior chamber with a longitudinal axis, closed sides, a closed upper end, and a lower end with an aperture adjacent thereto;

heating means within said chamber and having heating surfaces extending in the longitudinal direction of said chamber to define a heating zone therein, with said chamber aperture adjacent the lower end of said heating zone to permit semiconductor wafers to be inserted within and retrieved from said heating zone, said heating means including a plurality of separate heat generating portions;

support means for supporting semiconductor wafers with each wafer having a surface extending substantially parallel to said heating surfaces and positioned so that each semiconductor wafer within the heating zone is heated by said plurality of heat generating portions;

a process tube having a first portion disposed within said heating zone for receipt of semiconductor wafers during heat treating thereof and a second portion extending through said chamber aperture to define a cooling zone for cooling semiconductor wafers without direct contact of the wafers with the exterior atmosphere; and means for moving said support means to position semiconductor wafers supported on said support means between a first position within said process tube first portion and a second position within said process tube second portion.

35. An apparatus for heat treating semiconductor wafers, comprising:

a high temperature furnace having a vertically extending, elongated interior chamber with a longitudinal axis, close sides, a closed upper end, and a lower end with an aperture adjacent thereto;

heating means within said chamber and having heating surfaces extending in the longitudinal direction of said chamber to define a heating zone therein, with said chamber aperture adjacent the lower end of said heating zone to permit semiconductor wafers to be inserted within and retrieved from said heating zone, said heating means including a plurality of separate heat generating portions;

a process tube extending longitudinally within said heating zone for receipt of the semiconductor wafers therein;

support means for supporting semiconductor wafers with each wafer having a surface extending substantially parallel to said heating surfaces and positioned so that each semiconductor wafer within the heating zone is heated by said plurality of heat generating portions;

means for moving said support means within said process tube to position semiconductor wafers supported on said support means between a first position outside said heating zone and a second position within said heating zone; and means for supplying process gas to the upper portion of said process tube to cause the gas to flow downward in said process tube around semiconductor wafers supported therein, said process tube including means for preheating the process gas within the process tube.

36. An apparatus for controlling heat treatment of semiconductor wafers in a high temperature furnace, comprising:

heating means adapted to be disposed within the high temperature furnace to define a heating zone therein, said heating means including at least one flat heater plate having an upper portion, a lower portion, a right portion, a left portion, and a central portion encircled by said upper, lower, right and left portions;

transfer means adapted to successively supply and retrieve semiconductor wafers into and from said heating zone;

measuring means for measuring the temperature within said heating zone immediately before each wafer is supplied thereto by said transfer means; and correction means for correcting the temperature of said central portion of said heating means based on the measured temperature to maintain the temperature within said heating zone immediately before each wafer is supplied thereto substantially constant.

37. An apparatus for controlling heat treatment of semiconductor wafers in a high temperature furnace, comprising:

heating means adapted to be disposed within the high temperature furnace to define a heating zone therein, said heating means including at least one flat heater plate having an upper portion, a lower portion, a right portion, a left portion, and a central portion encircled by said upper, lower, right and left portions;

transfer means adapted to successively supply and retrieve semiconductor wafers into and from said heating zone;

measuring means for measuring the temperature of a surface of a semiconductor wafer within said heating zone immediately before the wafer is retrieved therefrom by said transfer means; and correction means for correcting the temperature of said central portion of said heating means based on the measured temperature to cause the temperatures of the surfaces of second and subsequent semiconductor wafers within said heating zone to substantially reach a preset value before retrieval thereof from said heating zone.

38. An apparatus for heating treating semiconductor wafers, comprising:

a high temperature furnace having a vertically extending, elongated interior chamber with a longitudinal axis, closed sides, a closed upper end, and a lower end with an aperture adjacent thereto;

heating means within said chamber and having heating surfaces extending in the longitudinal direction of said chamber to define a heating zone therein, with said chamber aperture adjacent the lower end of said heating zone to permit semiconductor wafers to be inserted within and retrieved from said heating zone; and support means for supporting two semiconductor wafers, said support means including a ring member adapted to be disposed adjacent the peripheral portion of semiconductor wafers supported on said support means while being separated therefrom, said ring member comprising a looped strip with a width greater than the gap between two semiconductor wafers supported on said support means and being disposed at a position to shield said gap.

39. A method of heat treating semiconductor wafers using a high temperature furnace having therein heating means adjacent a heating zone, said method comprising the steps of:

(a) activating the heating means to bring the temperature within the heating zone to a predetermined value;

(b) loading a semiconductor wafer into the heating zone;

(c) heat treating the semiconductor wafer within the heating zone;

(d) retrieving the semiconductor wafer from the heating zone;

(e) measuring the temperature within the heating zone;

(f) loading another semiconductor wafer into the heating zone;

(g) heat treating the another semiconductor wafer within the heating zone;

(h) retrieving the another semiconductor wafer from the heating zone;

(i) measuring the temperature within the heating zone;

(j) determining the difference between the temperature of the heating zone as measured in step (e) and the temperature of the heating zone as measured in step (i);

(k) measuring the temperature of the heating means;

(l) activating the heating means to bring the temperature of the heating means to a value equal to the temperature of the heating means as measured in step (k) plus the difference determined in step (j); and (m) repeating wafers have been heat treated.

40. A method according to claim 39, further comprising the step of returning the temperature of the heating means to the predetermined value when the supply of semiconductor wafers is interrupted.

* * * * *